(12) United States Patent
Yagishita et al.

(10) Patent No.: US 7,371,644 B2
(45) Date of Patent: May 13, 2008

(54) SEMICONDUCTOR DEVICE AND METHOD OF FABRICATING THE SAME

(75) Inventors: Atsushi Yagishita, Yokohama (JP);
Akio Kaneko, Kawasaki (JP);
Kazunari Ishimaru, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/404,772

(22) Filed: Apr. 17, 2006

(65) Prior Publication Data
US 2006/0275988 A1 Dec. 7, 2006

(30) Foreign Application Priority Data
Jun. 3, 2005 (JP) ............................ 2005-164210

(51) Int. Cl.
*H01L 21/336* (2006.01)
(52) U.S. Cl. ................ 438/268; 438/270; 257/E27.057
(58) Field of Classification Search ........ 438/268–270; 257/263–267, 328–334, E27.057
See application file for complete search history.

(56) References Cited

U.S. PATENT DOCUMENTS

| | | | |
|---|---|---|---|
| 6,911,383 B2 | 6/2005 | Doris et al. | |
| 7,250,658 B2 | 7/2007 | Doris et al. | |
| 2004/0061178 A1* | 4/2004 | Lin et al. | ..................... 257/350 |

FOREIGN PATENT DOCUMENTS

| | | |
|---|---|---|
| CN | 1591838 A | 3/2005 |
| JP | 2005-19996 | 1/2005 |

OTHER PUBLICATIONS

Notification of the First Office Action issued by the Chinese Patent Office on Sep. 14, 2007, for Chinese Patent Application No. 200610088529.9, and English-language translation thereof.

Choi, et al., "A Spacer Patterning Technology for Nanoscale CMOS," IEEE Transactions on Electron Devices, vol. 49, No. 3, pp. 436-441, Mar. 2002.

* cited by examiner

*Primary Examiner*—H. Jey Tsai
(74) *Attorney, Agent, or Firm*—Finnegan, Henderson, Farabow, Garrett & Dunner, L.L.P.

(57) ABSTRACT

According to the present invention, there is provided a semiconductor device fabrication method, comprising:
depositing a mask material on a semiconductor substrate;
patterning the mask material and forming a trench in a surface portion of the semiconductor substrate by etching, thereby forming a first projection in a first region, and a second projection wider than the first projection in a second region;
burying a device isolation insulating film in the trench;
etching away a predetermined amount of the device isolation insulating film formed in the first region;
etching away the mask material formed in the second region;
forming a first gate insulating film on a pair of opposing side surfaces of the first projection, and a second gate insulating film on an upper surface of the second projection;
depositing a first gate electrode material on the device isolation insulating film, mask material, and second gate insulating film;
planarizing the first gate electrode material by using as stoppers the mask material formed in the first region and the device isolation insulating film formed in the second region;
depositing a second gate electrode material on the mask material, first gate electrode material, and device isolation insulating film; and
patterning the first and second gate electrode materials, thereby forming a first gate electrode in the first region, and a second gate electrode in the second region.

5 Claims, 37 Drawing Sheets

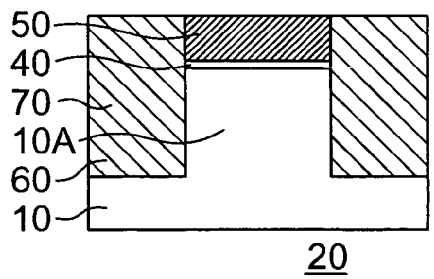
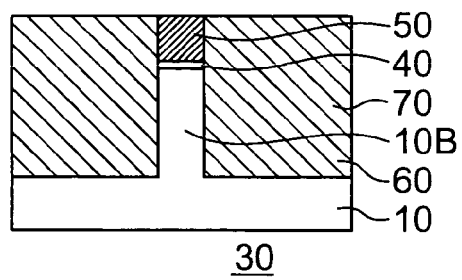
FIG. 1A          FIG. 1B
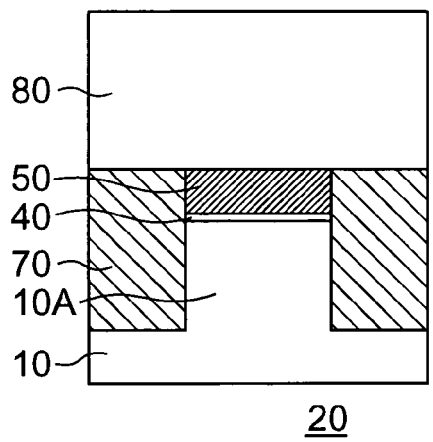
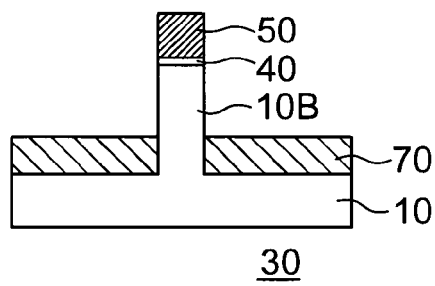
FIG. 2A          FIG. 2B
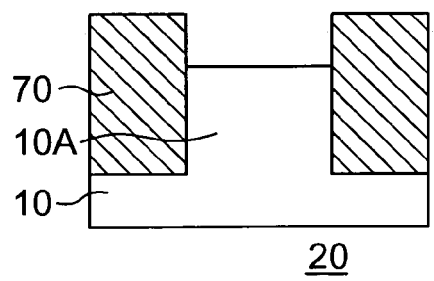
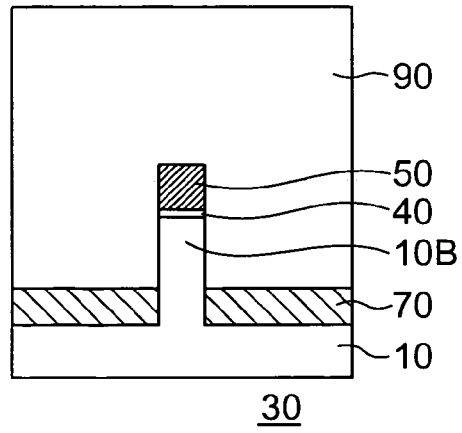
FIG. 3A          FIG. 3B

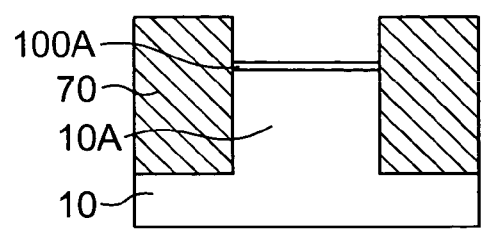
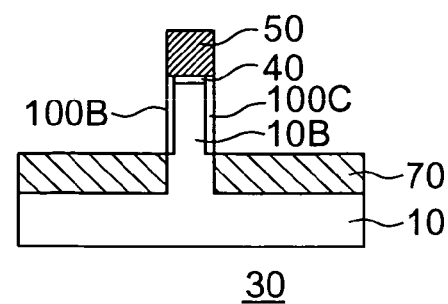
FIG. 4A   FIG. 4B
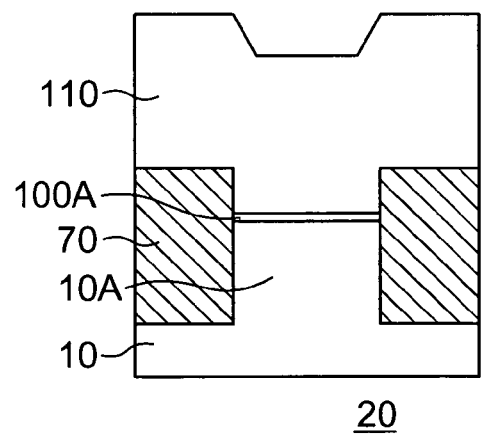
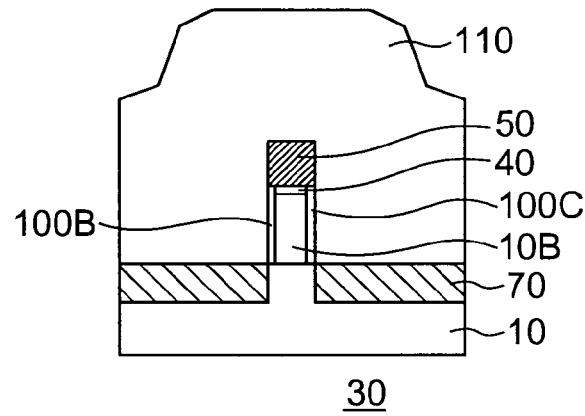
FIG. 5A   FIG. 5B
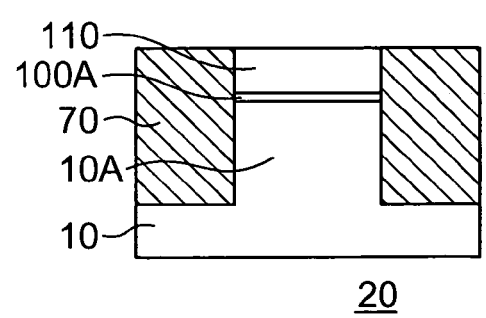
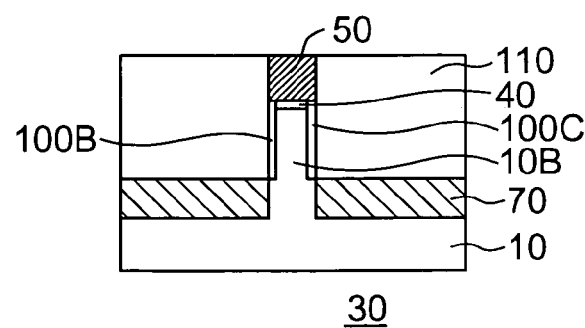
FIG. 6A   FIG. 6B

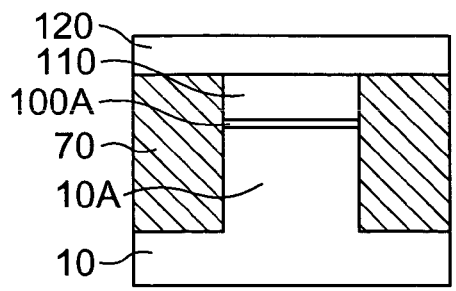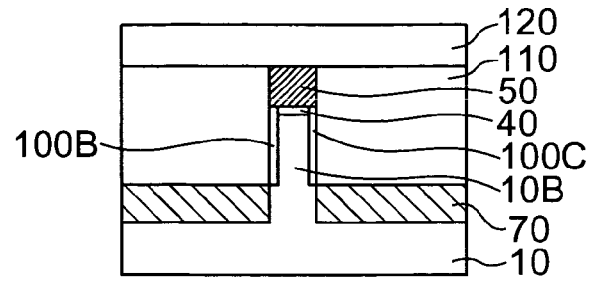
FIG. 7A    FIG. 7B
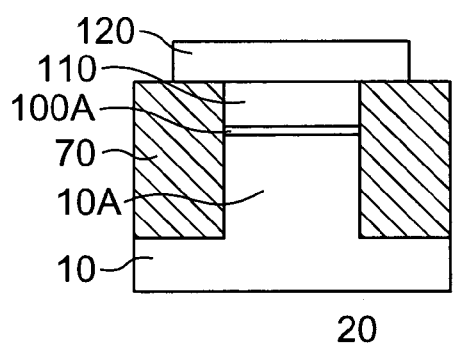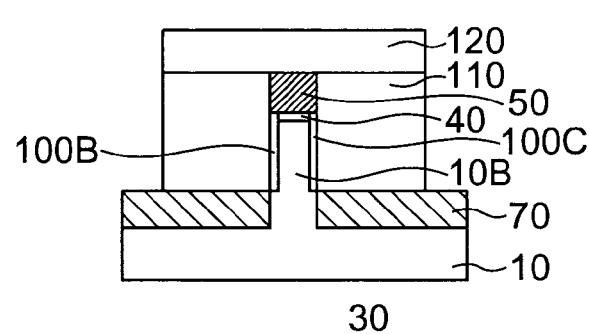
FIG. 8A    FIG. 8B
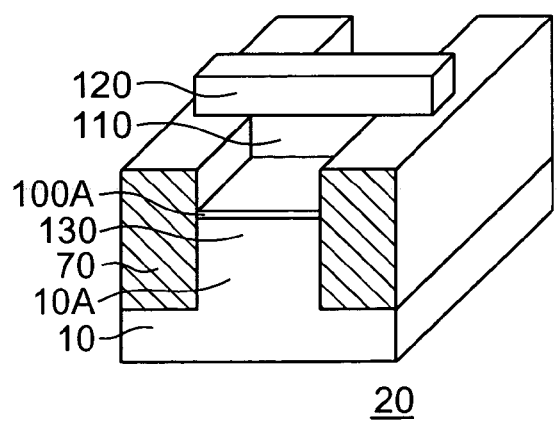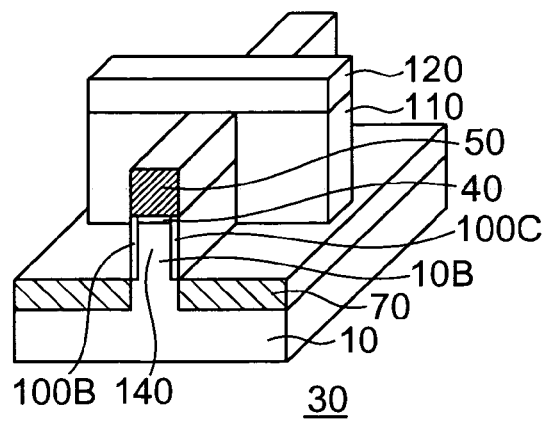
FIG. 9A    FIG. 9B

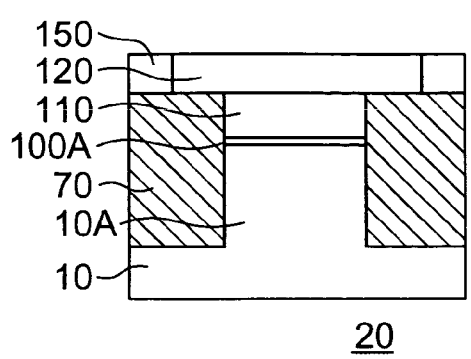 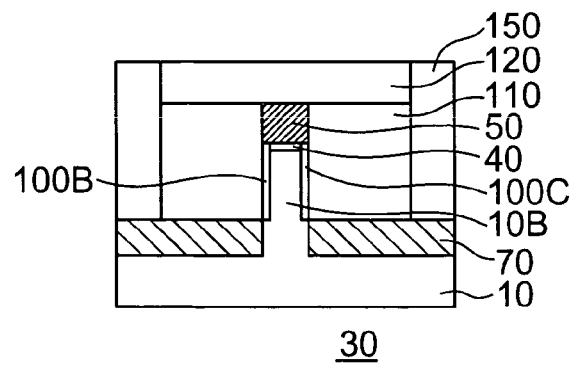
FIG. 10A  FIG. 10B
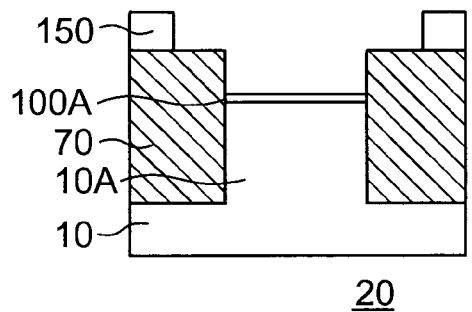 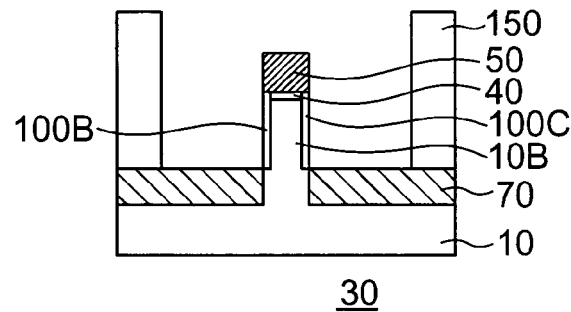
FIG. 11A  FIG. 11B
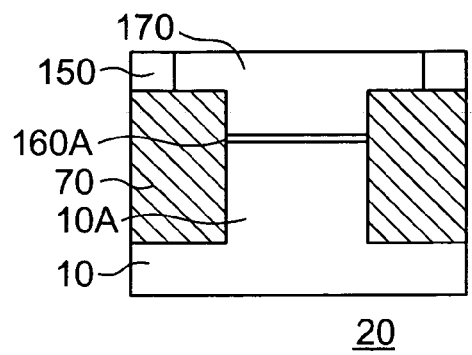 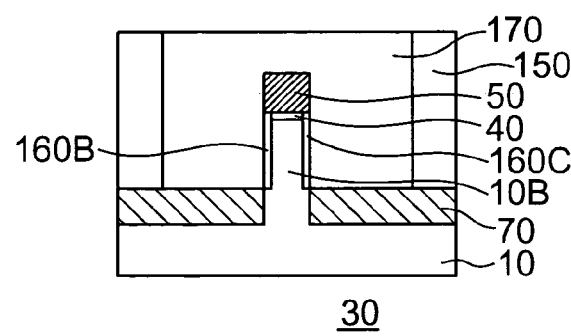
FIG. 12A  FIG. 12B

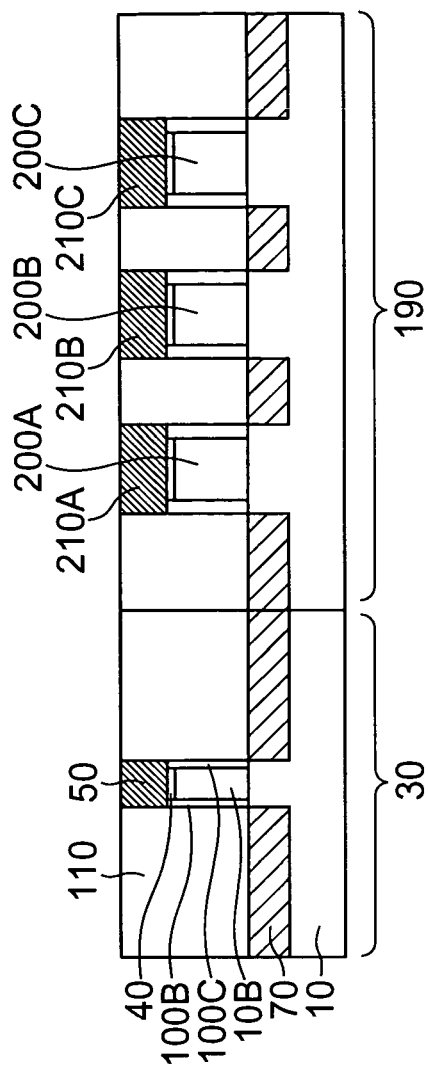
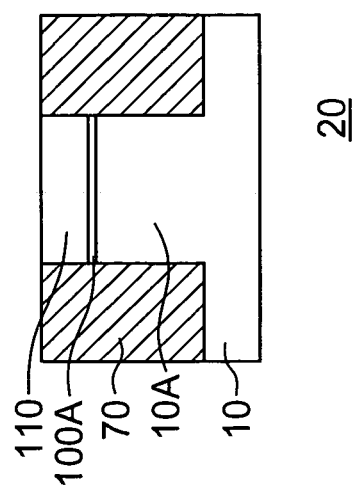
FIG. 15B
FIG. 15A

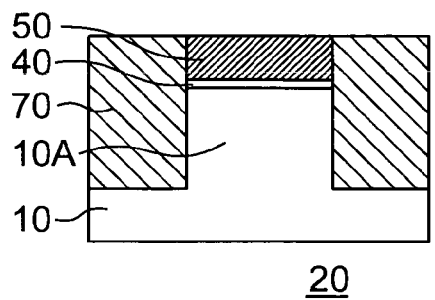
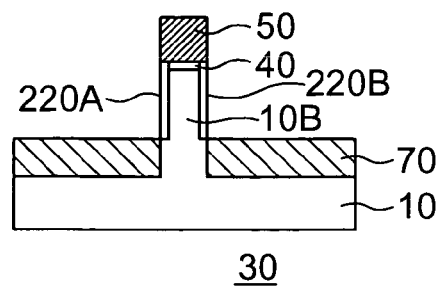
FIG. 16A   FIG. 16B
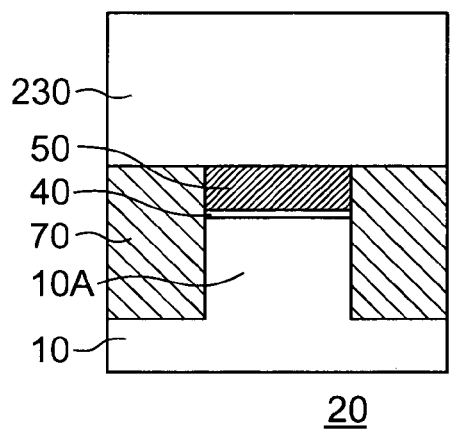
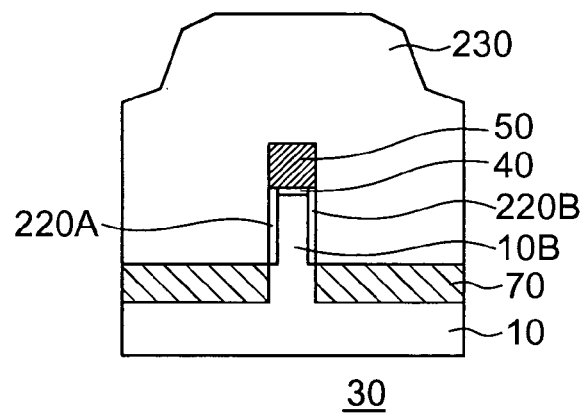
FIG. 17A   FIG. 17B
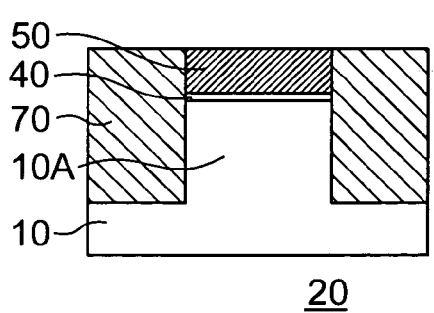
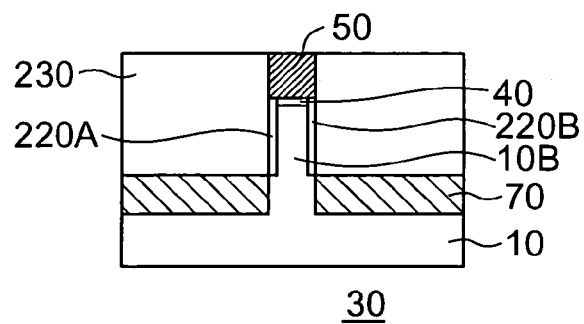
FIG. 18A   FIG. 18B

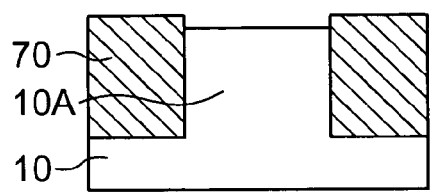
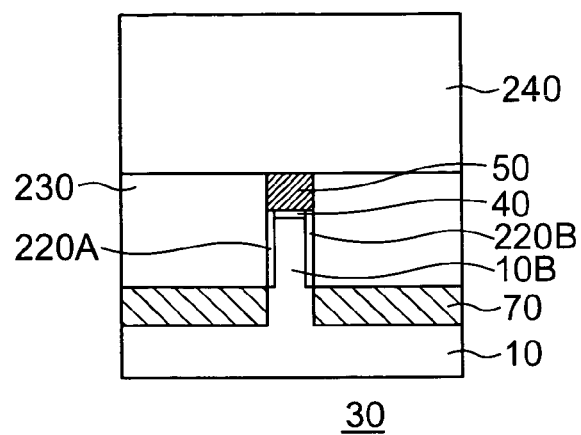
FIG. 19A   FIG. 19B
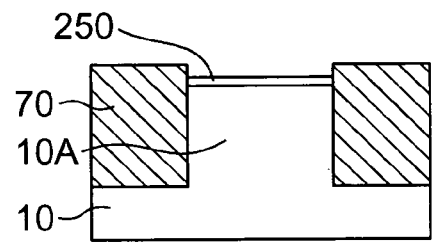
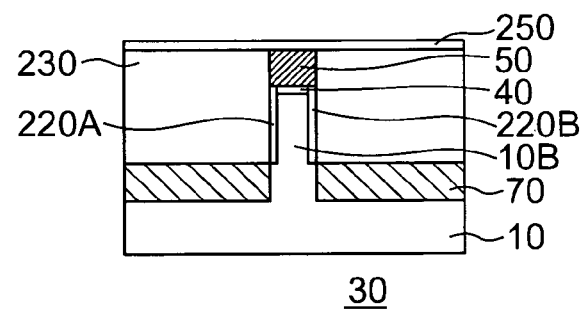
FIG. 20A   FIG. 20B
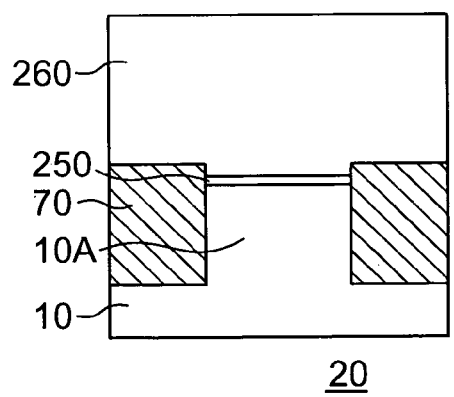
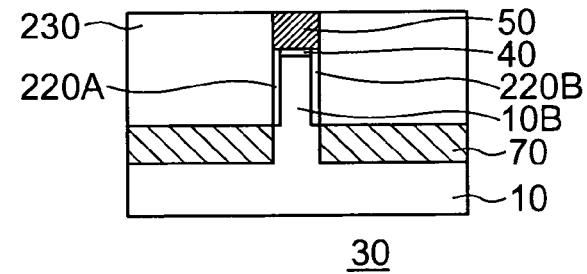
FIG. 21A   FIG. 21B

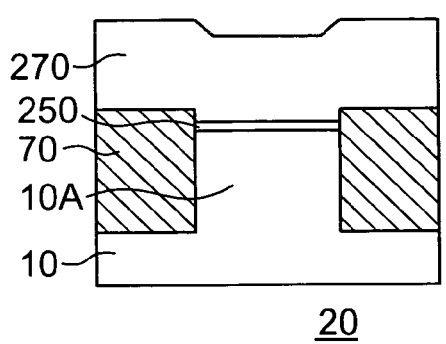 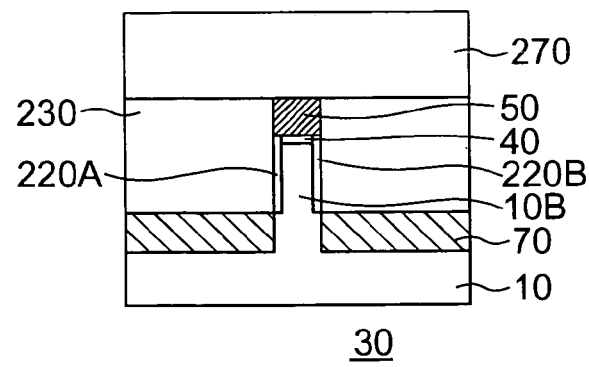
FIG. 22A  FIG. 22B
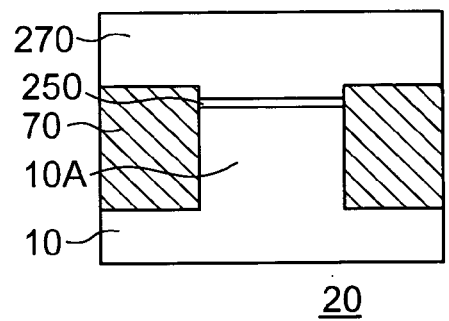 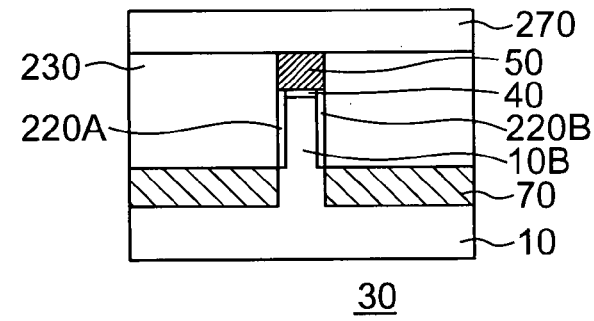
FIG. 23A  FIG. 23B
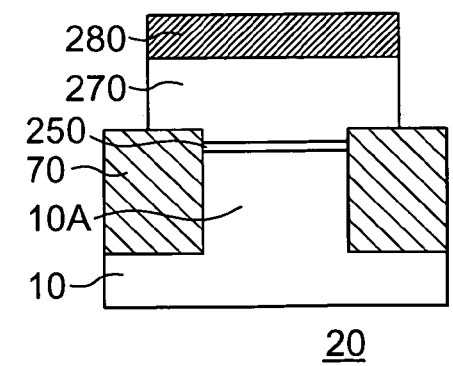 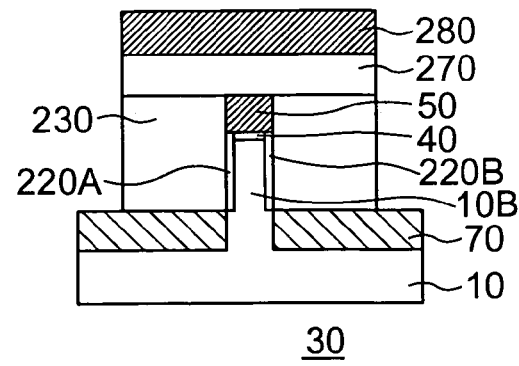
FIG. 24A  FIG. 24B

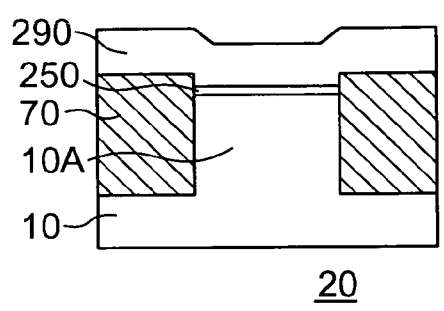
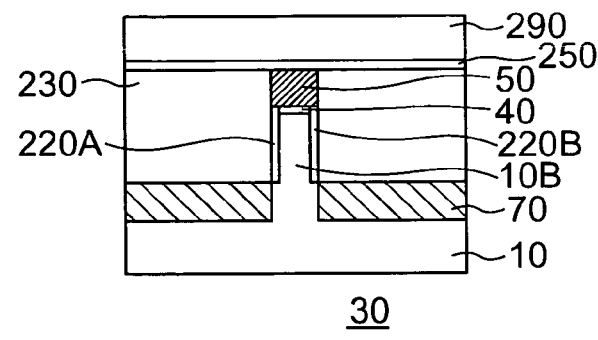
FIG. 25A    FIG. 25B
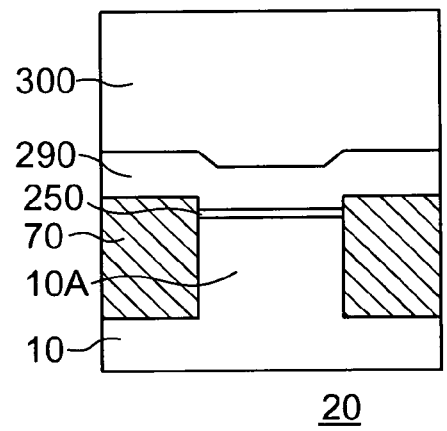
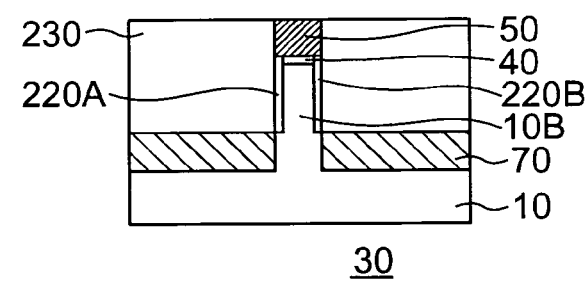
FIG. 26A    FIG. 26B
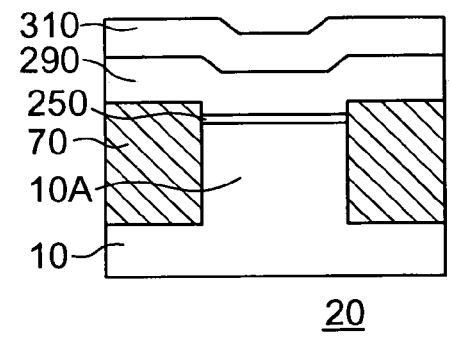
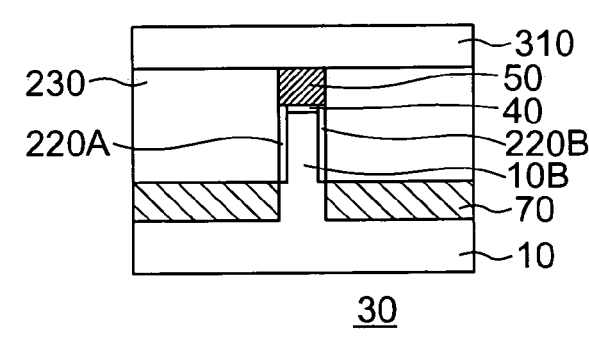
FIG. 27A    FIG. 27B

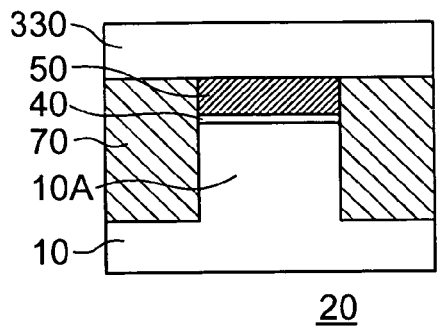
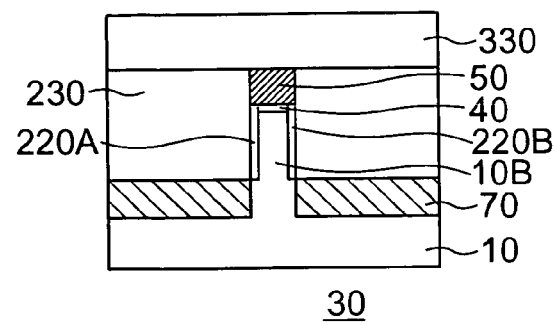
FIG. 29A    FIG. 29B
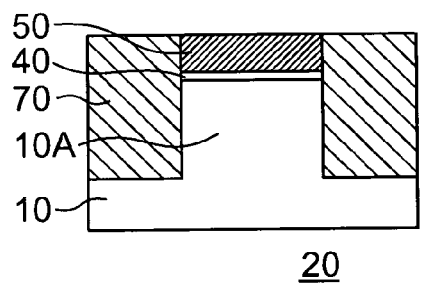
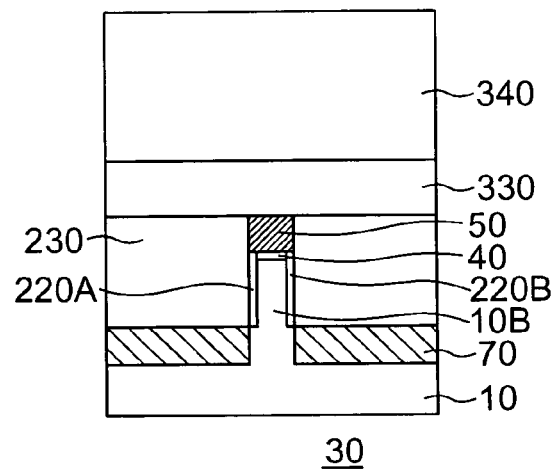
FIG. 30A    FIG. 30B
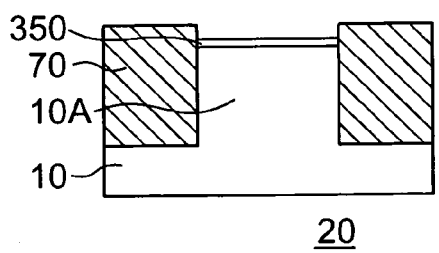
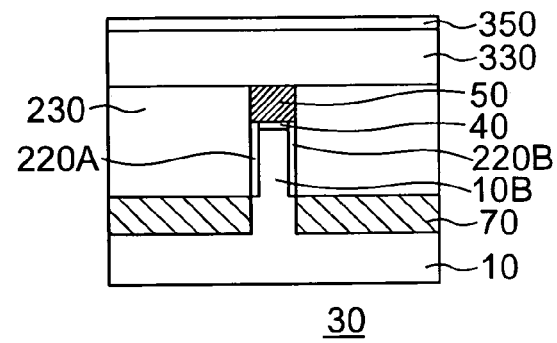
FIG. 31A    FIG. 31B

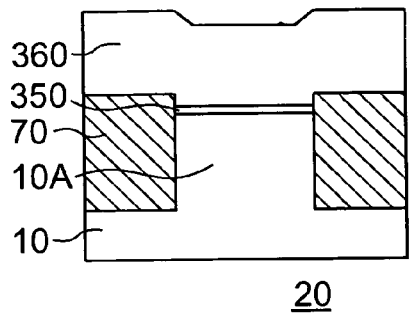 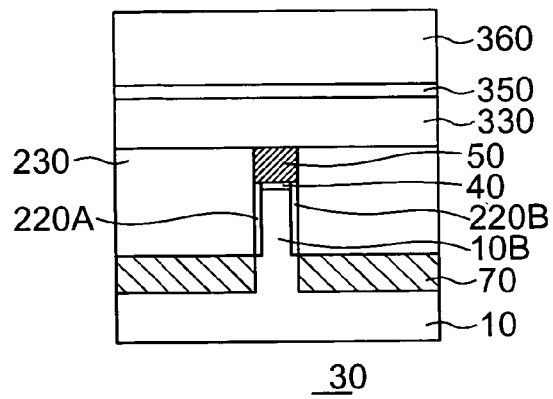
FIG. 32A   FIG. 32B
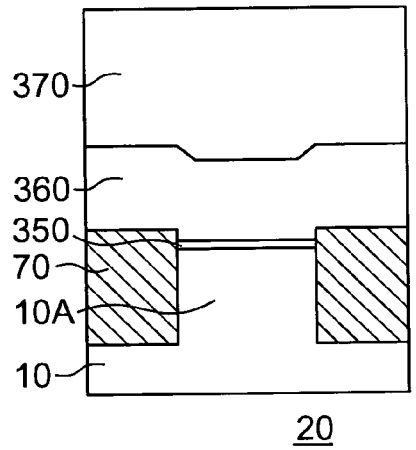 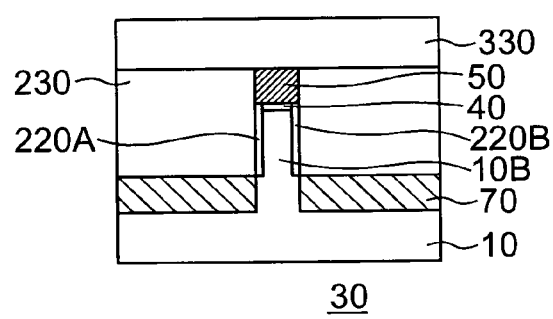
FIG. 33A   FIG. 33B
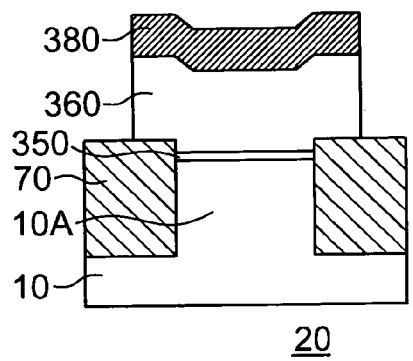 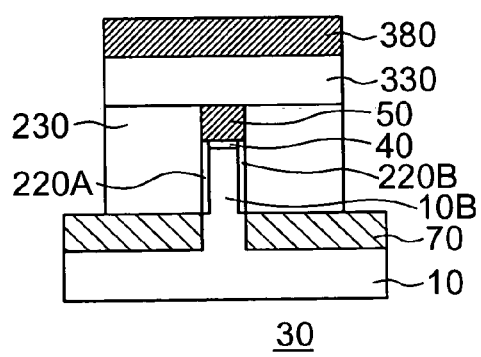
FIG. 34A   FIG. 34B

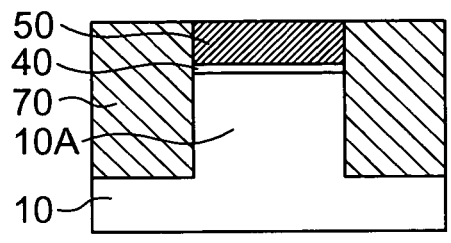 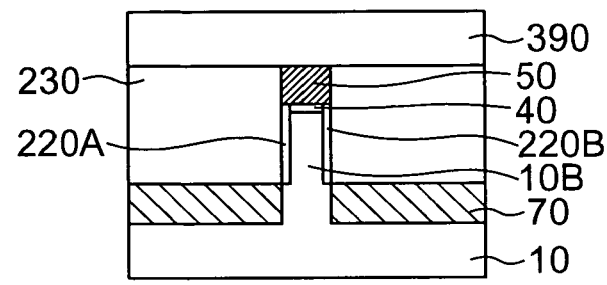
FIG. 35A   FIG. 35B
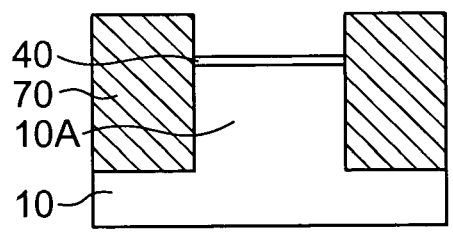 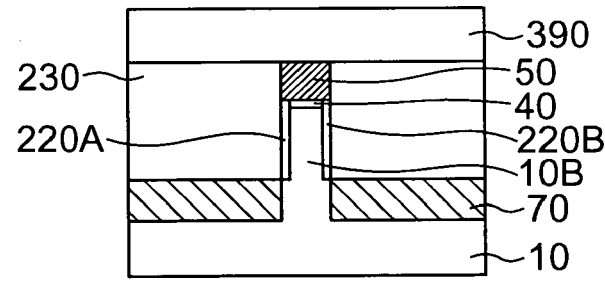
FIG. 36A   FIG. 36B

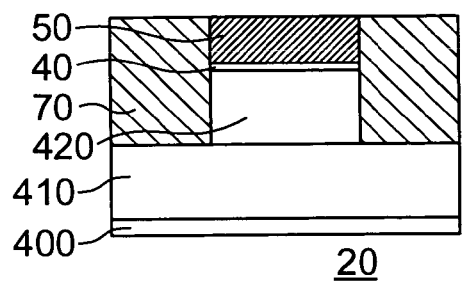 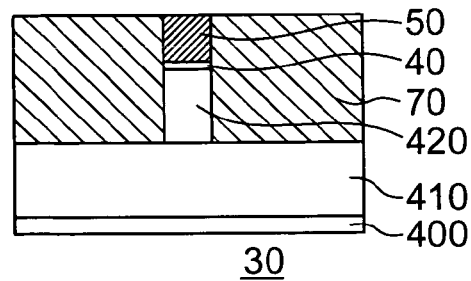
FIG. 37A  FIG. 37B
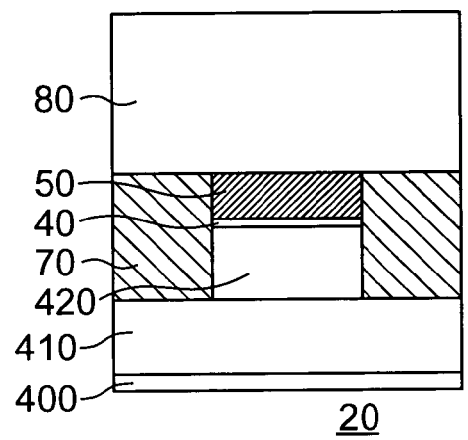 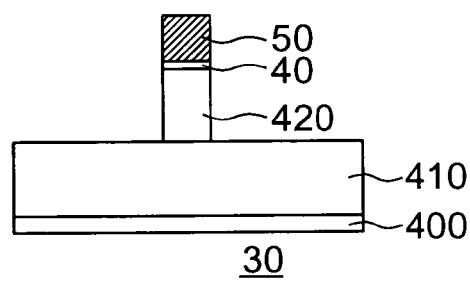
FIG. 38A  FIG. 38B
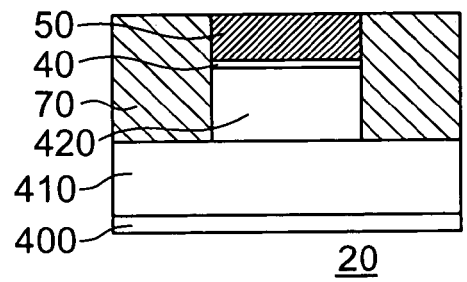 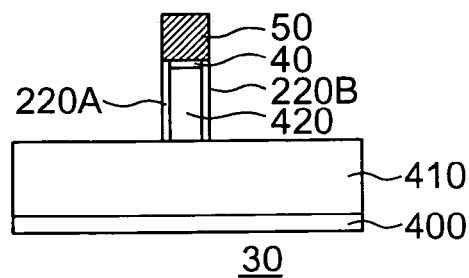
FIG. 39A  FIG. 39B

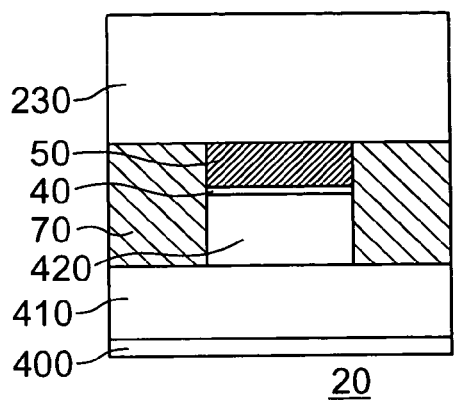 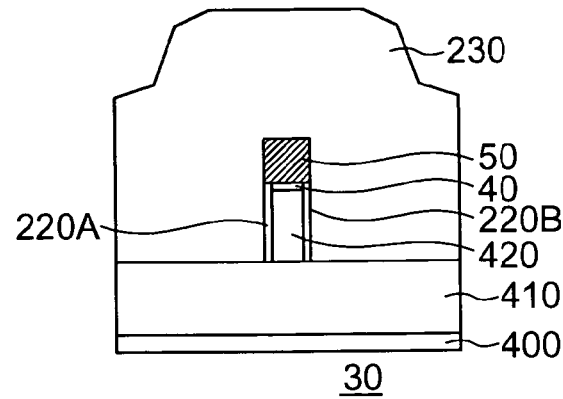
FIG. 40A  FIG. 40B
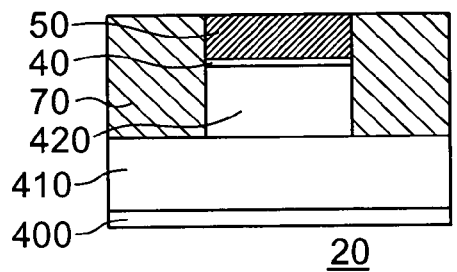 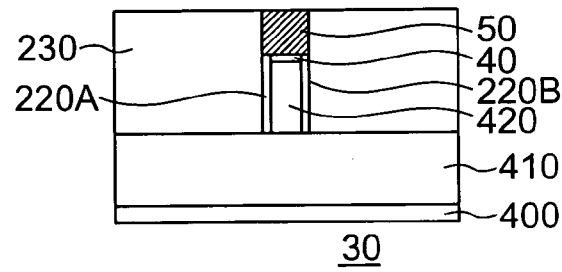
FIG. 41A  FIG. 41B
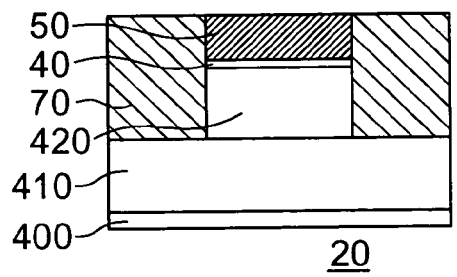 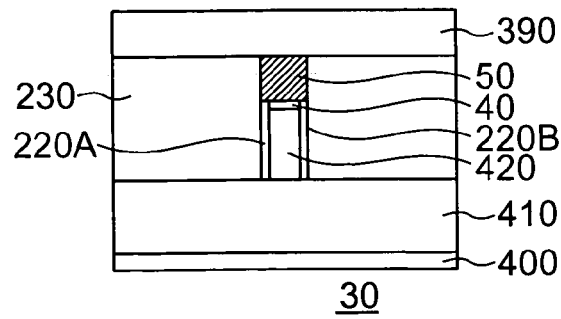
FIG. 42A  FIG. 42B

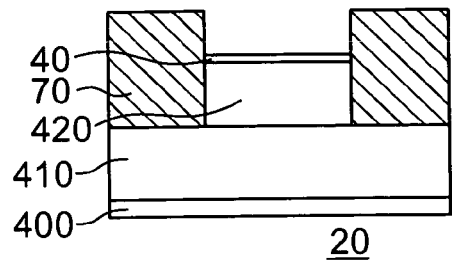
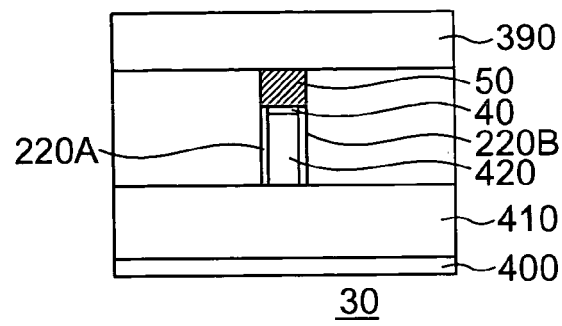
FIG. 43A          FIG. 43B
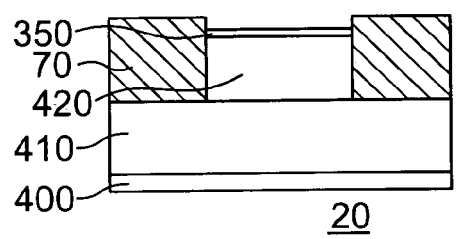
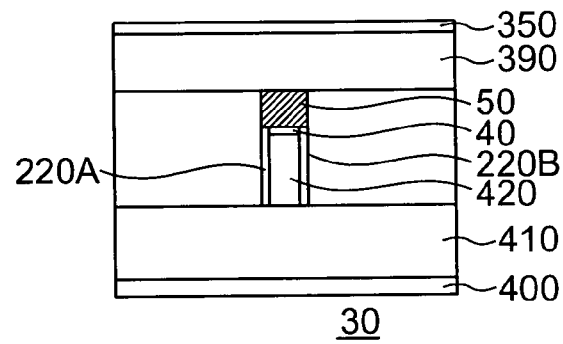
FIG. 44A          FIG. 44B
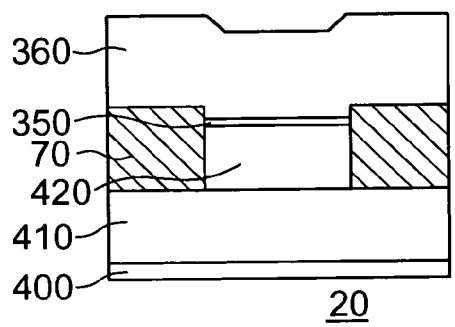
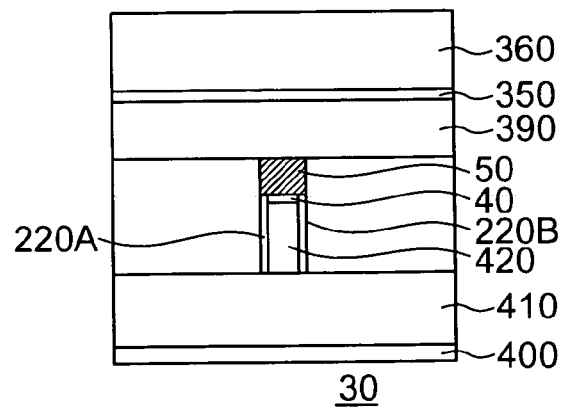
FIG. 45A          FIG. 45B

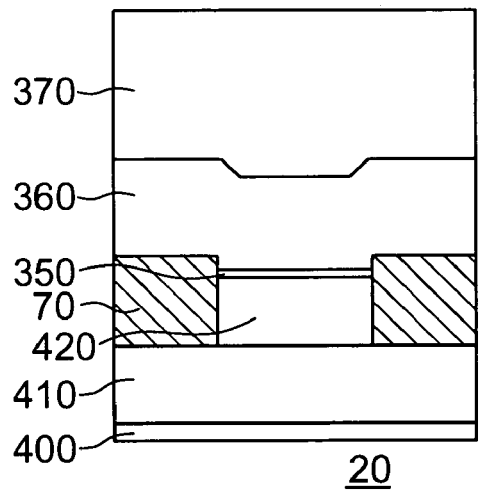
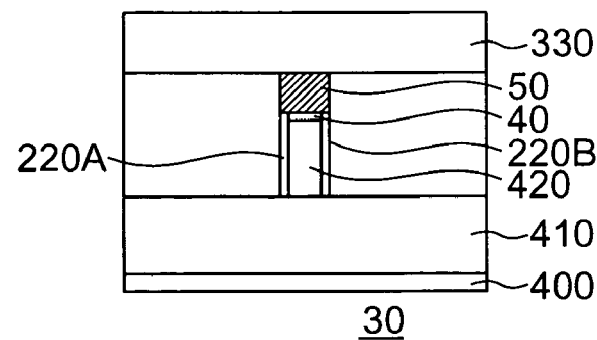
FIG. 46A  FIG. 46B
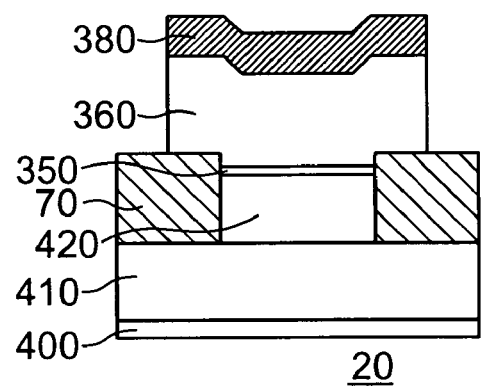
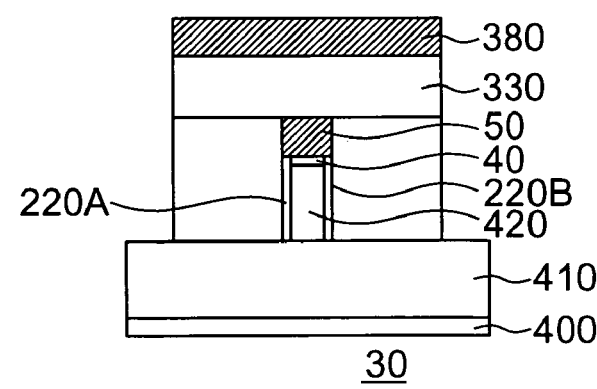
FIG. 47A  FIG. 47B

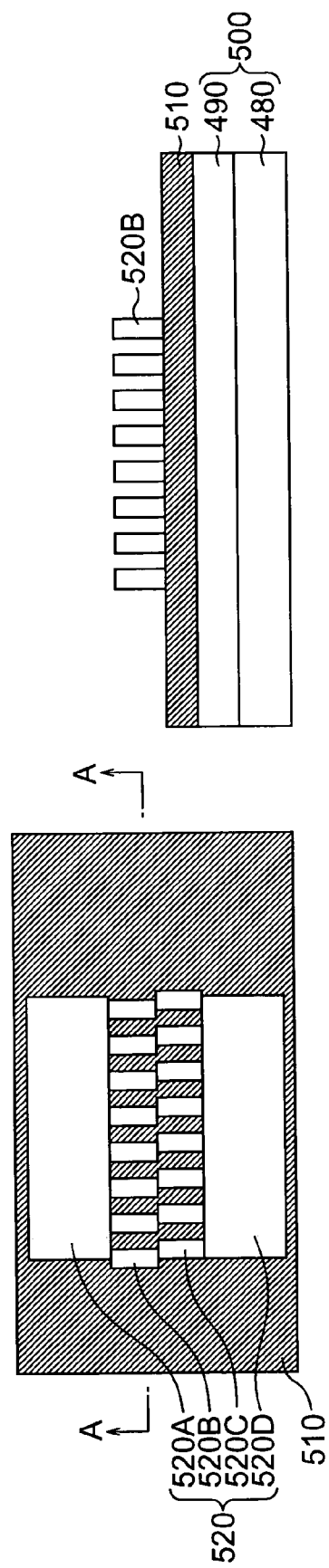

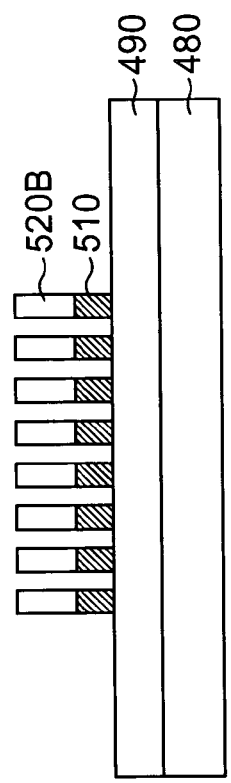
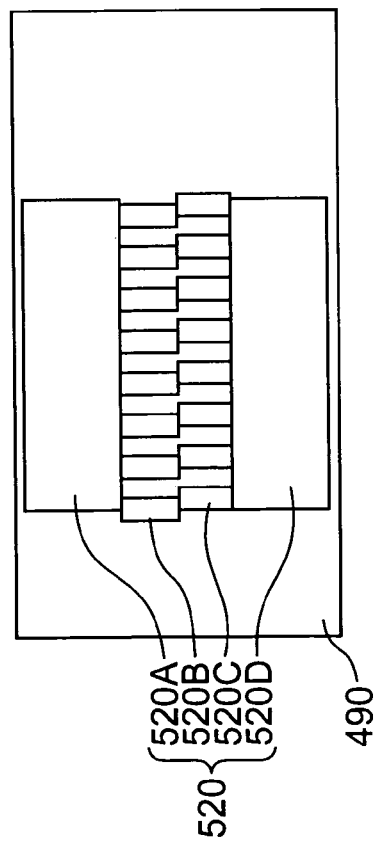
FIG. 52B
FIG. 52A

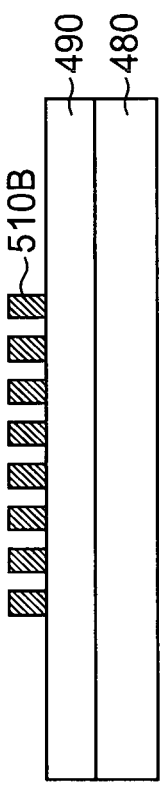
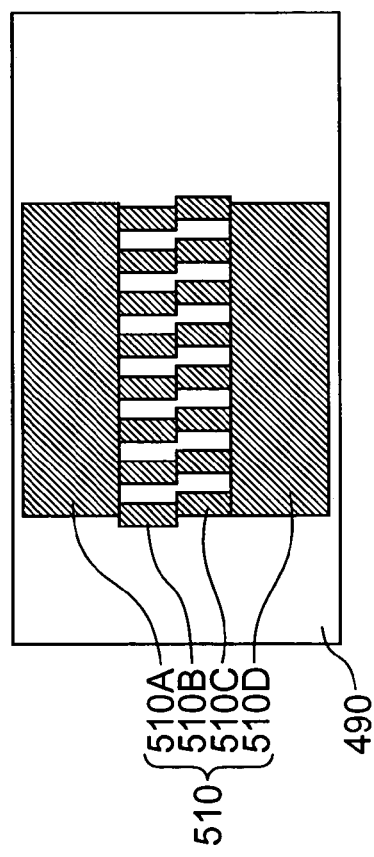
FIG. 53B
FIG. 53A

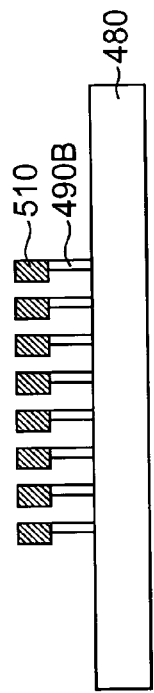
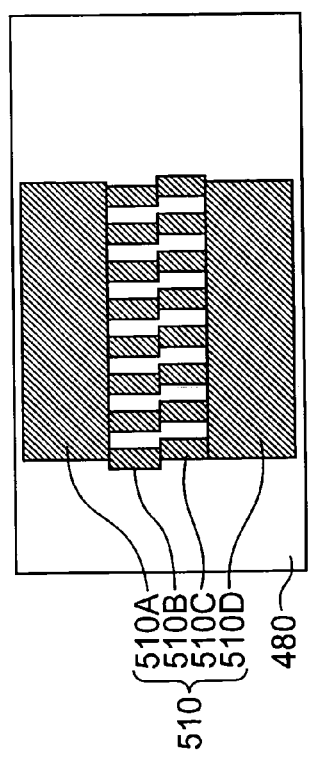
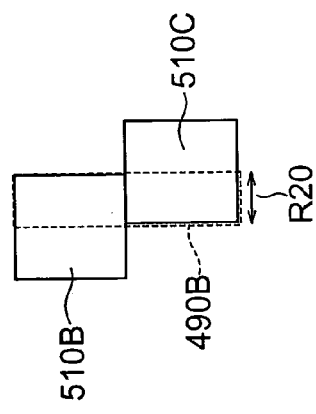
FIG. 54B
FIG. 54A
FIG. 54C

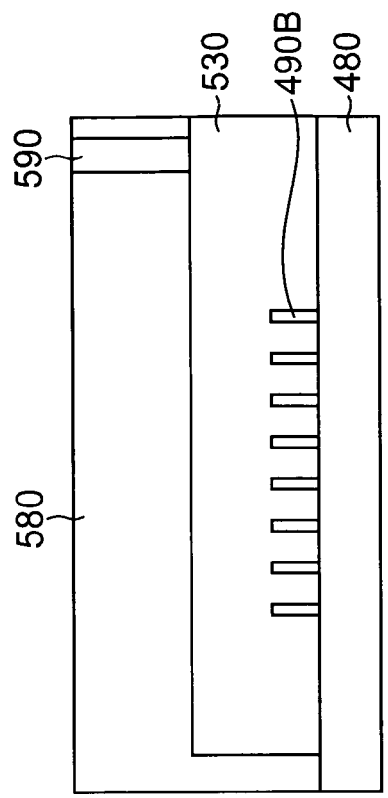
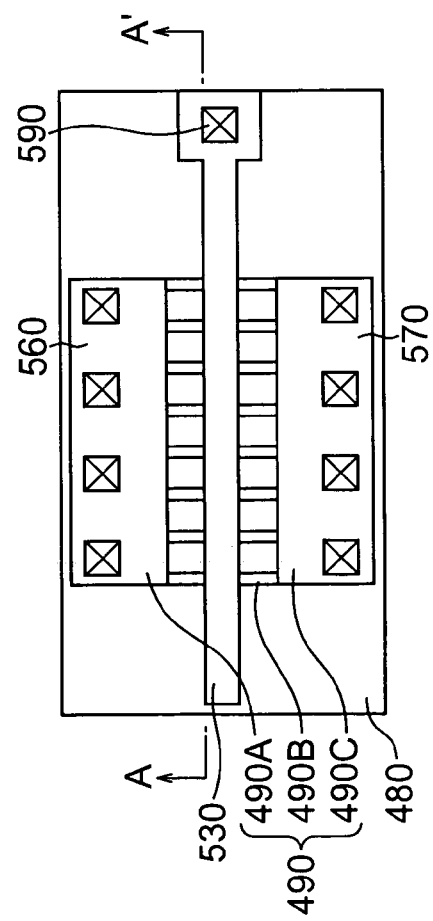
FIG. 56B
FIG. 56A

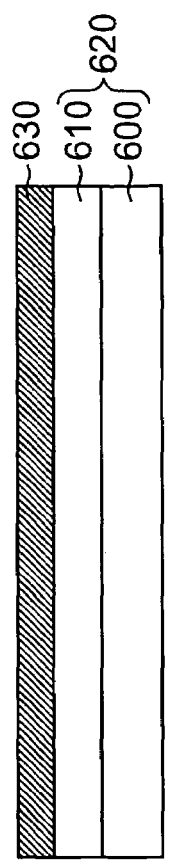
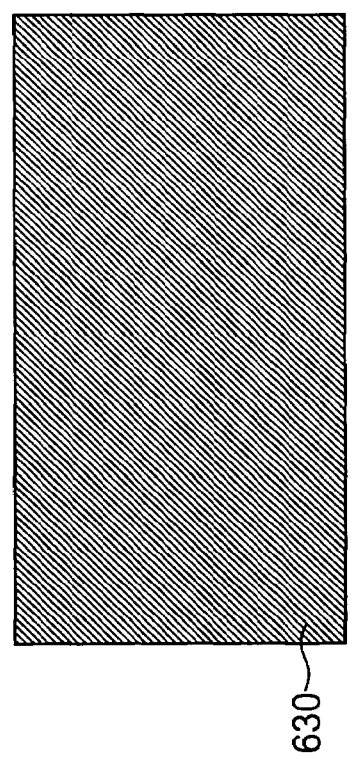
FIG. 57B
FIG. 57A

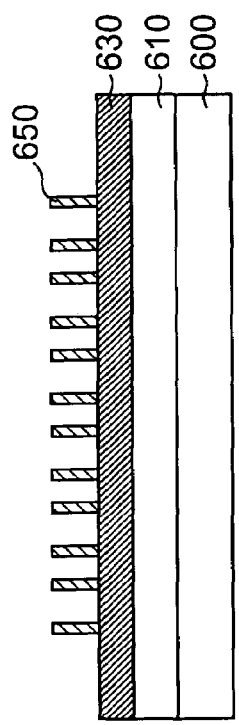
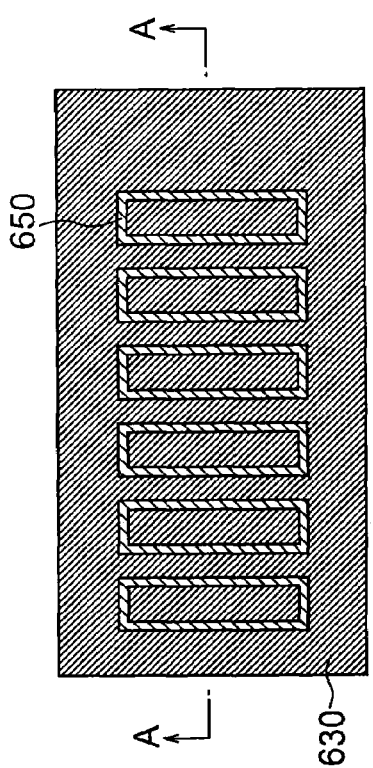
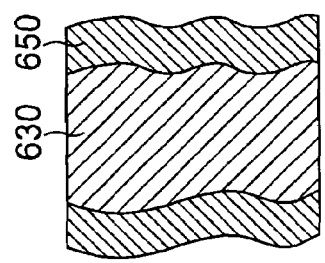
FIG. 59B
FIG. 59A
FIG. 59C

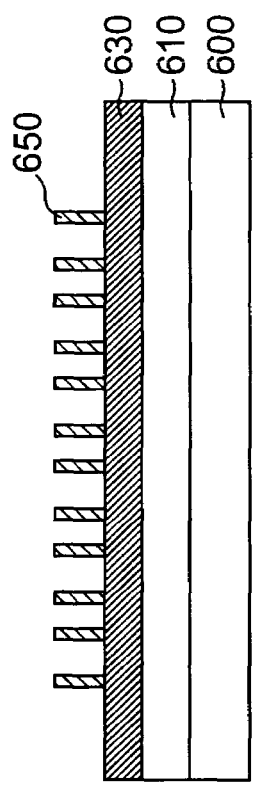
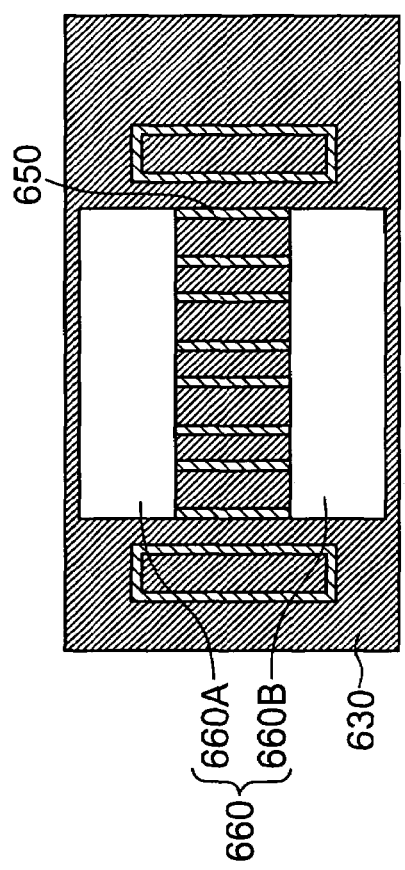
FIG. 60B
FIG. 60A

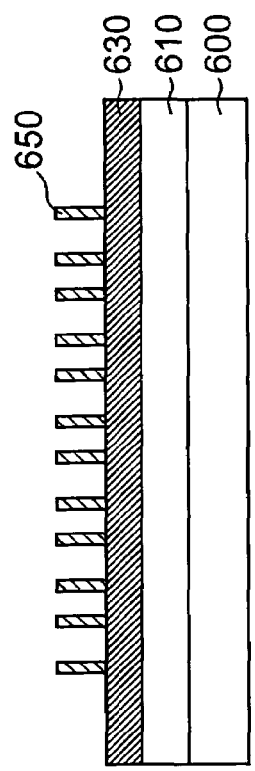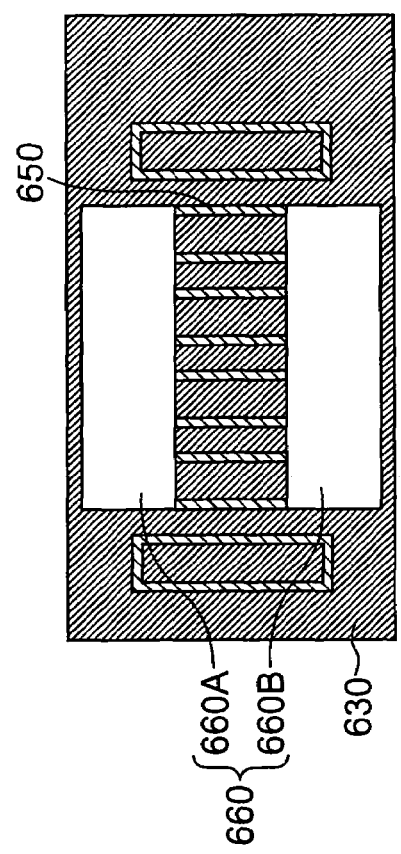
FIG. 61B
FIG. 61A

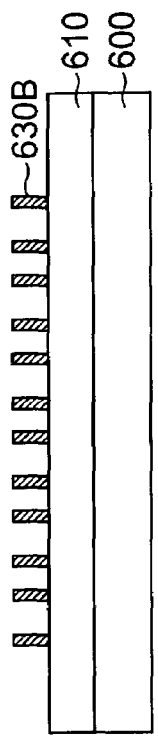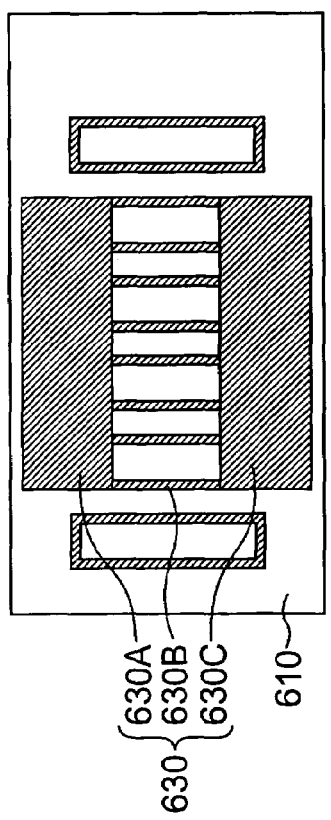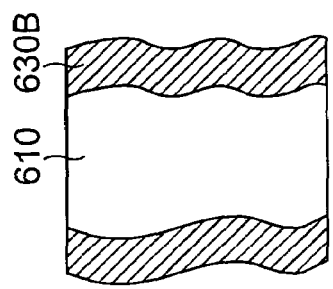
FIG. 62B
FIG. 62A
FIG. 62C

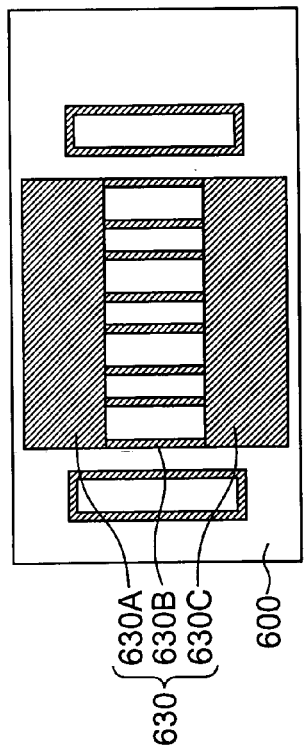
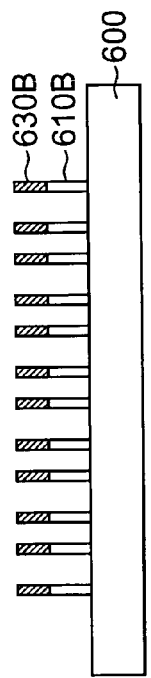
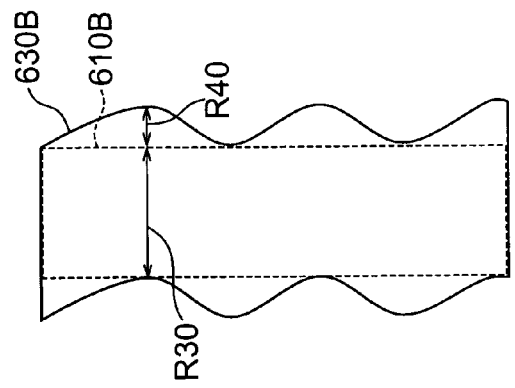
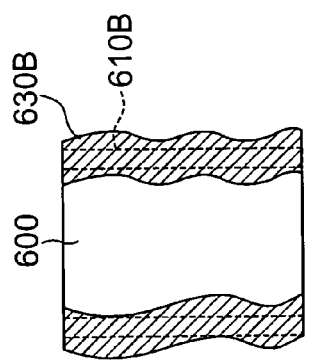
FIG. 63A
FIG. 63B
FIG. 63C
FIG. 63D

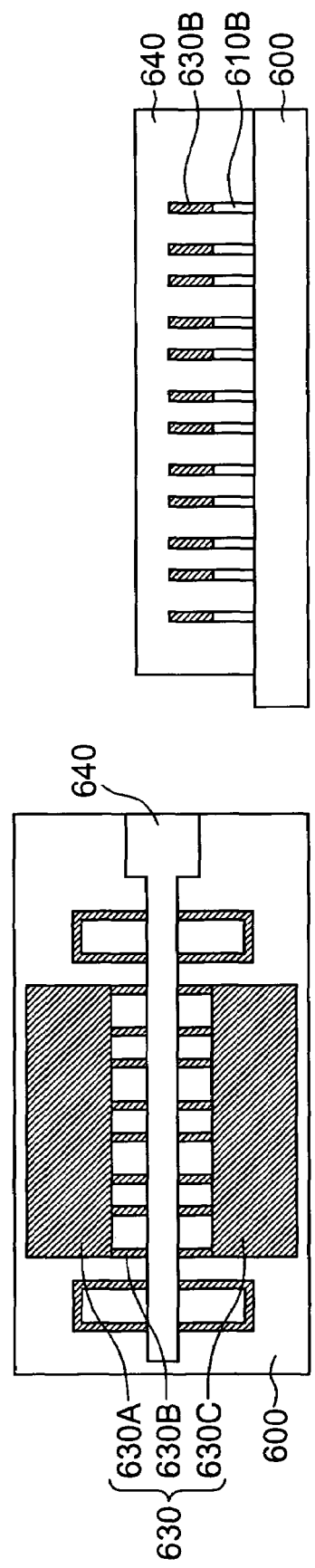

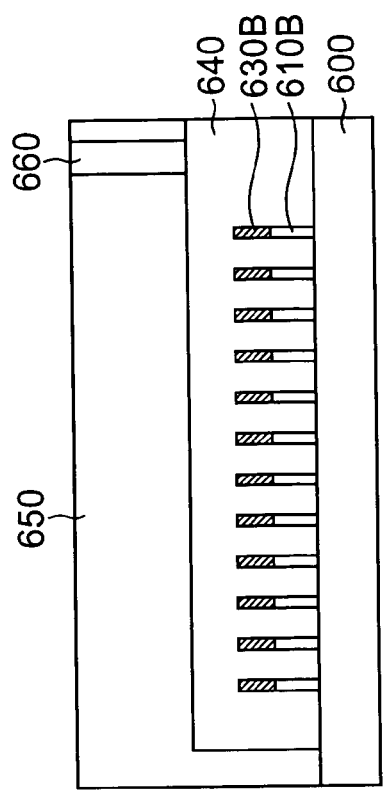
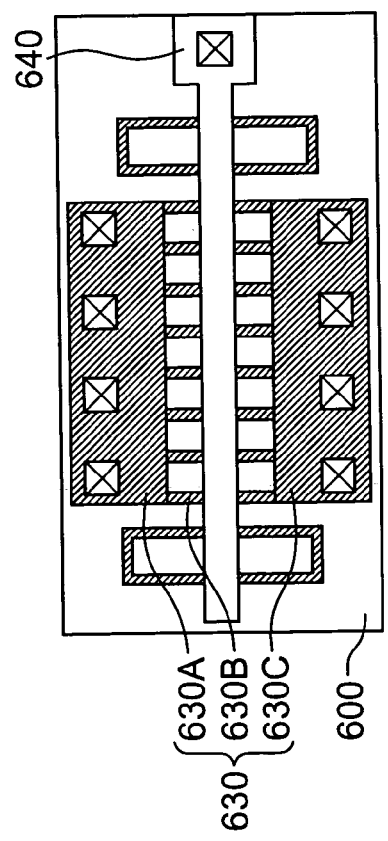
FIG. 65B
FIG. 65A

US 7,371,644 B2

SEMICONDUCTOR DEVICE AND METHOD OF FABRICATING THE SAME

CROSS REFERENCE TO RELATED APPLICATION

This application is based upon and claims benefit of priority under 35 USC §119 from the Japanese Patent Application No. 2005-164210, filed on Jun. 3, 2005, the entire contents of which are incorporated herein by reference.

BACKGROUND OF THE INVENTION

The present invention relates to a semiconductor device and a method of fabricating the same.

Recently, so-called double-gate-structure MOSFETs are developed, and a MOSFET having a Fin-shaped semiconductor layer is called a FinFET. This FinFET is considered to be promising as a next-generation transistor structure because the fabrication cost is low and the cutoff characteristics are good.

A planar MOSFET, however, is superior to the FinFET in realizing a device having a high gate threshold voltage or in fabricating an analog device. In an actual LSI, therefore, both the planar MOSFET and FinFET must be embedded, and a simple fabrication process of embedding both the planar MOSFET and FinFET is being sought.

Unfortunately, when both the planar MOSFET and FinFET are to be embedded, the surface of a gate electrode material is roughened when it is deposited, and this makes the formation of a fine gate pattern impossible.

A reference concerning a method of fabricating a semiconductor device in which both the planar MOSFET and FinFET are embedded is as follows.

Japanese Patent Laid-Open No. 2005-19996

SUMMARY OF THE INVENTION

According to one aspect of the invention, there is provided a semiconductor device fabrication method, comprising:

depositing a mask material on a semiconductor substrate;

patterning the mask material and forming a trench in a surface portion of the semiconductor substrate by etching, thereby forming a first projection in a first region, and a second projection wider than the first projection in a second region;

burying a device isolation insulating film in the trench;

etching away a predetermined amount of the device isolation insulating film formed in the first region;

etching away the mask material formed in the second region;

forming a first gate insulating film on a pair of opposing side surfaces of the first projection, and a second gate insulating film on an upper surface of the second projection;

depositing a first gate electrode material on the device isolation insulating film, mask material, and second gate insulating film;

planarizing the first gate electrode material by using as stoppers the mask material formed in the first region and the device isolation insulating film formed in the second region;

depositing a second gate electrode material on the mask material, first gate electrode material, and device isolation insulating film; and patterning the first and second gate electrode materials, thereby forming a first gate electrode in the first region, and a second gate electrode in the second region.

According to one aspect of the invention, there is provided a semiconductor device fabrication method comprising:

depositing a mask material on a semiconductor substrate;

patterning the mask material and forming a trench in a surface portion of the semiconductor substrate by etching, thereby forming a first projection in a first region, and a second projection wider than the first projection in a second region;

burying a device isolation insulating film in the trench;

etching away a predetermined amount of the device isolation insulating film formed in the first region;

forming a first gate insulating film on a pair of opposing side surfaces of the first projection;

depositing a first gate electrode material on the mask material and device isolation insulating film;

planarizing the first gate electrode material by using the mask material and device isolation insulating film as stoppers;

etching away the mask material formed in the second region;

forming a second gate insulating film in the first and second regions; and removing the second gate insulating film formed in the first region.

According to one aspect of the invention, there is provided a semiconductor device fabrication method comprising:

forming, along a <112> direction, a mask having a pattern in which undulations are formed in a direction perpendicular to the <112> direction on a semiconductor substrate whose crystal orientation is (110); and removing the semiconductor substrate by a predetermined depth by etching having crystal orientation dependence by using the mask, and also removing the semiconductor substrate positioned below a projection of the mask, thereby forming a projection having side surfaces whose crystal orientation is (111).

According to one aspect of the invention, there is provided a semiconductor device comprising:

a projection formed in a first region of a surface portion of a semiconductor substrate having a surface whose crystal orientation is (110);

a first gate electrode formed via a first gate insulating film on a pair of opposing side surfaces whose crystal orientation is (111), which are side surfaces of said projection;

an N-channel transistor having a first source region and first drain region formed, in said projection, on two sides of a first channel region formed between said pair of opposing side surfaces whose crystal orientation is (111), and on side surfaces where said first gate electrode is not formed;

a second gate electrode formed in a second region on the surface of said semiconductor substrate via a second gate insulating film; and a P-channel transistor having a second source region and second drain region formed on two sides of a second channel region formed below said second gate electrode, in a surface portion of the second region of said semiconductor substrate.

BRIEF DESCRIPTION OF THE DRAWINGS

FIGS. 1A and 1B are longitudinal sectional views showing the sectional structure of elements in a predetermined step of a semiconductor device fabrication method according to the first embodiment of the present invention;

FIGS. 2A and 2B are longitudinal sectional views showing the sectional structure of elements in a predetermined step of the semiconductor device fabrication method;

FIGS. 3A and 3B are longitudinal sectional views showing the sectional structure of elements in a predetermined step of the semiconductor device fabrication method;

FIGS. 4A and 4B are longitudinal sectional views showing the sectional structure of elements in a predetermined step of the semiconductor device fabrication method;

FIGS. 5A and 5B are longitudinal sectional views showing the sectional structure of elements in a predetermined step of the semiconductor device fabrication method;

FIGS. 6A and 6B are longitudinal sectional views showing the sectional structure of elements in a predetermined step of the semiconductor device fabrication method;

FIGS. 7A and 7B are longitudinal sectional views showing the sectional structure of elements in a predetermined step of the semiconductor device fabrication method;

FIGS. 8A and 8B are longitudinal sectional views showing the sectional structure of elements in a predetermined step of the semiconductor device fabrication method;

FIGS. 9A and 9B are perspective views of elements in a predetermined step of the same semiconductor device fabrication method;

FIGS. 10A and 10B are longitudinal sectional views showing the sectional structure of elements in a predetermined step of a semiconductor device fabrication method according to the second embodiment of the present invention;

FIGS. 11A and 11B are longitudinal sectional views showing the sectional structure of elements in a predetermined step of the semiconductor device fabrication method;

FIGS. 12A and 12B are longitudinal sectional views showing the sectional structure of elements in a predetermined step of the semiconductor device fabrication method;

FIGS. 15A and 15B are longitudinal sectional views showing the sectional structure of elements in a predetermined step of the semiconductor device fabrication method;

FIGS. 16A and 16B are longitudinal sectional views showing the sectional structure of elements in a predetermined step of a semiconductor device fabrication method according to the fifth embodiment of the present invention;

FIGS. 17A and 17B are longitudinal sectional views showing the sectional structure of elements in a predetermined step of the semiconductor device fabrication method;

FIGS. 18A and 18B are longitudinal sectional views showing the sectional structure of elements in a predetermined step of the semiconductor device fabrication method;

FIGS. 19A and 19B are longitudinal sectional views showing the sectional structure of elements in a predetermined step of the semiconductor device fabrication method;

FIGS. 20A and 20B are longitudinal sectional views showing the sectional structure of elements in a predetermined step of the semiconductor device fabrication method;

FIGS. 21A and 21B are longitudinal sectional views showing the sectional structure of elements in a predetermined step of the semiconductor device fabrication method;

FIGS. 22A and 22B are longitudinal sectional views showing the sectional structure of elements in a predetermined step of the semiconductor device fabrication method;

FIGS. 23A and 23B are longitudinal sectional views showing the sectional structure of elements in a predetermined step of the semiconductor device fabrication method;

FIGS. 24A and 24B are longitudinal sectional views showing the sectional structure of elements in a predetermined step of the semiconductor device fabrication method;

FIGS. 25A and 25B are longitudinal sectional views showing the sectional structure of elements in a predetermined step of a semiconductor device fabrication method according to the sixth embodiment of the present invention;

FIGS. 26A and 26B are longitudinal sectional views showing the sectional structure of elements in a predetermined step of the semiconductor device fabrication method;

FIGS. 27A and 27B are longitudinal sectional views showing the sectional structure of elements in a predetermined step of the semiconductor device fabrication method;

FIGS. 29A and 29B are longitudinal sectional views showing the sectional structure of elements in a predetermined step of a semiconductor device fabrication method according to the seventh embodiment of the present invention;

FIGS. 30A and 30B are longitudinal sectional views showing the sectional structure of elements in a predetermined step of the semiconductor device fabrication method;

FIGS. 31A and 31B are longitudinal sectional views showing the sectional structure of elements in a predetermined step of the semiconductor device fabrication method;

FIGS. 32A and 32B are longitudinal sectional views showing the sectional structure of elements in a predetermined step of the semiconductor device fabrication method;

FIGS. 33A and 33B are longitudinal sectional views showing the sectional structure of elements in a predetermined step of the semiconductor device fabrication method;

FIGS. 34A and 34B are longitudinal sectional views showing the sectional structure of elements in a predetermined step of the semiconductor device fabrication method;

FIGS. 35A and 35B are longitudinal sectional views showing the sectional structure of elements in a predetermined step of a semiconductor device fabrication method according to the eighth embodiment of the present invention;

FIGS. 36A and 36B are longitudinal sectional views showing the sectional structure of elements in a predetermined step of the semiconductor device fabrication method;

FIGS. 37A and 37B are longitudinal sectional views showing the sectional structure of elements in a predetermined step of a semiconductor device fabrication method according to the ninth embodiment of the present invention;

FIGS. 38A and 38B are longitudinal sectional views showing the sectional structure of elements in a predetermined step of the semiconductor device fabrication method;

FIGS. 39A and 39B are longitudinal sectional views showing the sectional structure of elements in a predetermined step of the semiconductor device fabrication method;

FIGS. 40A and 40B are longitudinal sectional views showing the sectional structure of elements in a predetermined step of the semiconductor device fabrication method;

FIGS. 41A and 41B are longitudinal sectional views showing the sectional structure of elements in a predetermined step of the semiconductor device fabrication method;

FIGS. 42A and 42B are longitudinal sectional views showing the sectional structure of elements in a predetermined step of the semiconductor device fabrication method;

FIGS. 43A and 43B are longitudinal sectional views showing the sectional structure of elements in a predetermined step of the semiconductor device fabrication method;

FIGS. 44A and 44B are longitudinal sectional views showing the sectional structure of elements in a predetermined step of the semiconductor device fabrication method;

FIGS. 45A and 45B are longitudinal sectional views showing the sectional structure of elements in a predetermined step of the semiconductor device fabrication method;

FIGS. 46A and 46B are longitudinal sectional views showing the sectional structure of elements in a predetermined step of the semiconductor device fabrication method;

FIGS. 47A and 47B are longitudinal sectional views showing the sectional structure of elements in a predetermined step of the semiconductor device fabrication method;

FIGS. 51A and 51B are longitudinal sectional views showing the sectional structure of elements in a predetermined step of a semiconductor device fabrication method according to the eleventh embodiment of the present invention;

FIGS. 52A and 52B are longitudinal sectional views showing the sectional structure of elements in a predetermined step of the semiconductor device fabrication method;

FIGS. 53A and 53B are longitudinal sectional views showing the sectional structure of elements in a predetermined step of the semiconductor device fabrication method;

FIGS. 54A, 54B and 54C are longitudinal sectional views showing the sectional structure of elements in a predetermined step of the semiconductor device fabrication method;

FIGS. 56A and 56B are longitudinal sectional views showing the sectional structure of elements in a predetermined step of the semiconductor device fabrication method;

FIGS. 57A and 57B are longitudinal sectional views showing the sectional structure of elements in a predetermined step of a semiconductor device fabrication method according to the twelfth embodiment of the present invention;

FIGS. 59A, 59B and 59C are longitudinal sectional views showing the sectional structure of elements in a predetermined step of the semiconductor device fabrication method;

FIGS. 60A and 60B are longitudinal sectional views showing the sectional structure of elements in a predetermined step of the semiconductor device fabrication method;

FIGS. 61A and 61B are longitudinal sectional views showing the sectional structure of elements in a predetermined step of the semiconductor device fabrication method;

FIGS. 62A, 62B and 62C are longitudinal sectional views showing the sectional structure of elements in a predetermined step of the semiconductor device fabrication method;

FIGS. 63A, 63B, 63C and 63D are longitudinal sectional views showing the sectional structure of elements in a predetermined step of the semiconductor device fabrication method;

FIGS. 64A and 64B are longitudinal sectional views showing the sectional structure of elements in a predetermined step of the semiconductor device fabrication method;

FIGS. 65A and 65B are longitudinal sectional views showing the sectional structure of elements in a predetermined step of the semiconductor device fabrication method;

DETAILED DESCRIPTION OF THE INVENTION

Figure 13A:
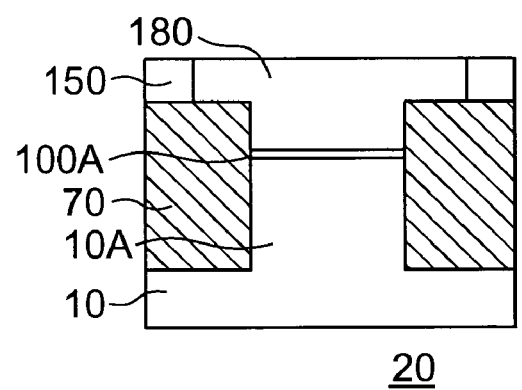
FIGS. 13A and 13B are longitudinal sectional views showing the sectional structure of elements in a predetermined step of a semiconductor device fabrication method according to the third embodiment of the present invention.

Embodiments of the present invention will be described below with reference to the accompanying drawings.

(1) First Embodiment

FIGS. 1A to 9B illustrate a semiconductor device fabrication method according to the first embodiment of the present invention. Note that FIGS. 1A to 9A illustrate a case in which a planar MOSFET is formed in a planar MOSFET region (i.e., a second region) 20 on a semiconductor substrate 10, and FIGS. 1B to 9B illustrate a case in which a FinFET is formed in a FinFET region (i.e., a first region) 30 on the semiconductor substrate 10.

As shown in FIGS. 1A and 1B, a silicon oxide ($SiO_2$) film 40 about 2 nm thick is formed on the semiconductor substrate 10, and a mask material 50 about 100 nm thick made of, e.g., a silicon nitride (SiN) film is deposited. Note that the mask material 50 is not limited to a silicon nitride (SiN) film, and another insulating film such as a silicon oxide film may also be used.

The mask material 50 and silicon oxide film 40 are sequentially patterned by lithography and RIE. In addition, the mask material 50 is used as a mask to etch the semiconductor substrate 10, thereby forming device isolation trenches 60 about 200 nm deep from the surface of the semiconductor substrate 10. At the same time, a projection 10A is formed on the planar MOSFET region 20, and a fin 10B is formed in the FinFET region 30.

High density plasma (HDP) CVD is used to deposit a device isolation insulating film 70 made of, e.g., a silicon oxide film on the entire surfaces of the semiconductor substrate 10 and mask material 50 so as to fill the device isolation trenches 60. The mask material 50 is used as a stopper to planarize the device isolation insulating film 70 by CMP, thereby exposing the upper surface of the mask material 50.

As shown in FIGS. 2A and 2B, the mask material 50 and device isolation insulating film 70 are coated with a photoresist, and exposure and development are performed to form a resist mask 80 having a pattern which opens in the FinFET region 30 of the semiconductor substrate 10, and cover the planar MOSFET region 20 with the resist mask 80.

The device isolation insulating film 70 formed in the FinFET region 30 is etched by RIE by using the mask material 50 and resist mask 80 as masks, thereby decreasing the film thickness of the device isolation insulating film 70 to about 100 nm. Note that wet etching using hydrofluoric acid (HF) may also be performed instead of RIE.

As shown in FIGS. 3A and 3B, after the resist mask 80 is removed, the mask material 50 and device isolation insulating film 70 are coated with a photoresist again, and exposure and development are performed to form a resist mask 90 having a pattern which opens in the planar MOSFET region 20 of the semiconductor substrate 10, and cover the FinFET region 30 with the resist mask 90.

The mask material 50 formed in the planar MOSFET region 20 is removed by RIE by using the resist mask 90 as a mask. After that, the silicon oxide film 40 formed in the planar MOSFET region 20 is removed by wet etching using hydrofluoric acid (HF).

This etching is performed by adjusting the process conditions such that the height of the device isolation insulating film 70 is about 70 nm on the basis of the surface of the projection 10A in the planar MOSFET region 20 of the semiconductor substrate 10. This makes it possible to protect the surface portion of the device isolation insulating film 70 from being etched, and to make the heights of the upper surfaces of the device isolation insulating film 70 and mask material 50 substantially equal.

As shown in FIGS. 4A and 4B, the resist mask 90 is removed, and a gate insulating film 100A about 1 nm thick made of, e.g., a silicon oxynitride (SiON) film is formed on the surface of the projection 10A in the planar MOSFET region 20 of the semiconductor substrate 10.

At the same time, gate insulating films 100B and 100C about 1 nm thick made of, e.g., silicon oxynitride (SiON) films are formed on a pair of opposing side surfaces of the fin 10B in the FinFET region 30.

As shown in FIGS. 5A and 5B, a gate electrode material 110 about 300 nm thick made of, e.g., polysilicon is deposited as a first layer by CVD or the like. As shown in FIGS. 6A and 6B, the gate electrode material 110 is planarized by CMP by using the device isolation insulating film 70 in the planar MOSFET region 20 and the mask material 50 in the FinFET region 30 as stoppers. In this manner, the gate electrode material 110 can be planarized over the entire surfaces of the planar MOSFET region 20 and FinFET region 30.

As shown in FIGS. 7A and 7B, a gate electrode material 120 made of, e.g., polysilicon is deposited as a second layer by CVD or the like. As shown in FIGS. 8A and 8B, the gate electrode materials 110 and 120 are patterned by lithography and RIE, thereby forming a gate pattern.

Note that this gate pattern may also be formed by using a so-called sidewall pattern transfer process. In this sidewall pattern transfer process, a dummy pattern is first formed on the gate electrode material 120, and sidewall insulating films (side walls) are formed on the side surfaces of this dummy pattern. Then, the dummy pattern is removed, and the sidewall insulating films are used as masks to pattern the gate electrode materials 110 and 120, thereby forming a gate pattern.

After that, sidewall insulating films (not shown) are formed on the side surfaces of a gate electrode made up of the gate electrode materials 110 and 120. As shown in FIGS. 9A and 9B, ion implantation is performed to form a source region 130 and a drain region (not shown) in the surface portion of the projection 10A in the planar MOSFET region 20 of the semiconductor substrate 10, and form a source region 140 and a drain region (not shown) in the fin 10B of the FinFET region 30. Note that oblique ion implantation or plasma doping can be used as ion implantation to the fin 10B in the FinFET region 30.

After a silicide film (not shown) is formed, an interlayer dielectric film (not shown) and contact plug (not shown) are sequentially formed to perform wiring, thereby forming a semiconductor device in which both the planar MOSFET and FinFET are embedded.

In this embodiment as described above, a semiconductor device in which both the planar MOSFET and FinFET are embedded can be fabricated by a simple process. In particular, the surface of the gate electrode material 120 can be planarized over the entire surfaces of the planar MOSFET region 20 and FinFET region 30, so a fine gate pattern can be formed.

That is, since the surface of the gate electrode material 120 can be planarized, the requirement for the DOP (Depth of Focus) of lithography can be alleviated. This makes it possible to increase the resolution (a minimum line width which can be formed), and form a fine gate pattern.

Also, since the surface of the gate electrode material 120 can be planarized, the sidewall pattern transfer process can be used. This sidewall pattern transfer process can form a gate pattern having a small width, i.e., fineness which cannot be formed by lithography, and having a small LER (Line Edge Roughness), i.e., small undulations (small variations in width and high uniformity).

Note that the device isolation insulating film 70 is planarized by CMP, the heights of the upper surfaces of the device isolation insulating film 70 and mask material 50 are made substantially equal (FIGS. 1A and 1B), the gate electrode material 110 is planarized by CMP (FIGS. 6A and 6B), and the gate electrode has a two-layered structure. Accordingly, the difference between the thickness in the substrate depth direction of the gate electrode materials 110 and 120 in the planar MOSFET region 20 and the thickness in the substrate depth direction of the gate electrode materials 110 and 120 in the FinFET region 30 (particularly in the vicinity of the two side surfaces of the fin 10B) is smaller than that when the upper surface of the device isolation insulating film 70 is lower than the upper surface of the mask material 50 and the gate electrode is not planarized.

Consequently, it is possible to reduce the time of overetching on the gate insulating film 100A in the planar MOSFET region 20 when the gate electrode materials 110 and 120 in the FinFET region 30 are patterned. Therefore, the overetching amount of the gate insulating film 100A can be reduced, and the reliability of the gate insulating film 100A can be improved.

(2) Second Embodiment

FIGS. 10A to 12B illustrate a semiconductor device fabrication method according to the second embodiment of the present invention. Note that the steps shown in FIGS. 1A to 9B in the first embodiment are the same as in the second embodiment, so an explanation thereof will be omitted.

This embodiment, however, differs from the first embodiment in that a gate electrode made up of gate electrode materials 110 and 120 is a dummy gate electrode to be removed later, and gate insulating films 100A to 100C are also dummy gate insulating films to be removed later.

As shown in FIGS. 10A and 10B, an interlayer dielectric film 150 made of, e.g., a silicon oxide film is deposited by using high density plasma CVD and planarized by CMP, thereby exposing the upper surface of the gate electrode material 120.

As shown in FIGS. 11A and 11B, a dummy gate electrode made up of the gate electrode materials 110 and 120 is removed by RIE. Note that wet etching or CDE (Chemical Dry Etching) may also be used instead of RIE.

As shown in FIGS. 12A and 12B, after the gate insulating films 100A to 100C as dummy gate insulating films are removed, gate insulating films 160A to 160C made of, e.g., high-k films are formed. Subsequently, a metal gate electrode material 170 made of a metal is deposited on the entire surface by CVD or the like and planarized by CMP by using the interlayer dielectric film 150 as a stopper, thereby forming a metal gate electrode.

After that, the same steps as in the first embodiment are executed to fabricate a semiconductor device in which both the planar MOSFET and FinFET are embedded.

In this embodiment as described above, as in the first embodiment, a semiconductor device in which both the planar MOSFET and FinFET are embedded can be fabricated by a simple process. In particular, the surface of the gate electrode material 120 can be planarized over the entire surfaces of a planar MOSFET region 20 and FinFET region 30, so a fine gate pattern can be formed.

Also, as in the first embodiment, the overetching amount of the gate insulating film 100A as a dummy gate insulating film can be reduced. This makes it possible to prevent overetching on a projection 10A of a semiconductor substrate 10.

Furthermore, as described above, the surface of the gate electrode material 120 as a dummy gate electrode can be planarized over the entire surfaces of the planar MOSFET region 20 and FinFET region 30. Therefore, a so-called damascene process can be performed as in this embodiment.

Additionally, in this embodiment, after source regions 130 and 140 and drain regions (not shown) are formed by a high-temperature annealing step, a metal gate electrode made of the metal gate electrode material 170 can be formed. As a consequence, the withstand voltage and reliability of the gate insulating films 160A to 160C can be improved.

Also, the gate threshold voltage can be adjusted by changing the work function (a minimum energy required to extract electrons outside) of the metal gate electrode material 170.

Note that the second embodiment described above is merely an example and does not limit the present invention. For example, it is also possible to replace only portions of the gate electrode materials 110 and 120 as a dummy gate electrode with the metal gate electrode material 170, instead of replacing the whole gate electrode materials 110 and 120 with the metal gate electrode material 170. More specifically, it is only necessary to replace only the gate electrode materials 110 and 120 in the FinFET region 30 with the metal gate electrode material 170, without replacing the gate electrode materials 110 and 120 in the planar MOSFET region 20.

(3) Third Embodiment

Figure 13B:
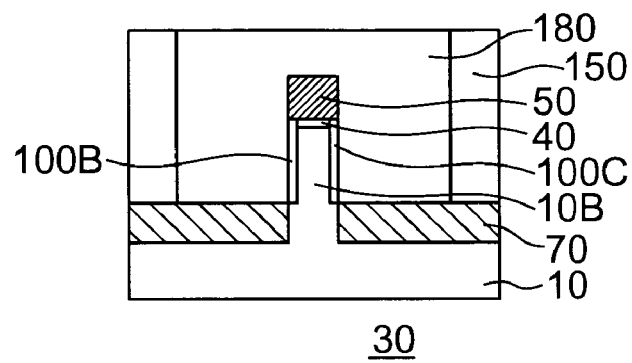

FIGS. 13A and 13B illustrate a semiconductor device fabrication method according to the third embodiment of the present invention. Note that the steps shown in FIGS. 1A to 9B in the first embodiment and the step shown in FIGS. 10A and 10B in the second embodiment are the same as in the third embodiment, so an explanation thereof will be omitted.

As shown in FIGS. 13A and 13B, a silicide material such as nickel is deposited on the entire surfaces of a gate electrode material 120 and interlayer dielectric film 150 made of, e.g., polysilicon. Then, an annealing step is performed to make a gate electrode material 110 and the gate electrode material 120 to completely react with the silicide material to form a silicide, and the unreacted silicide material is removed by wet etching, thereby forming a full-silicide gate electrode 180.

After that, the same steps as in the first embodiment are executed to fabricate a semiconductor device in which both the planar MOSFET and FinFET are embedded.

In this embodiment as described above, as in the first embodiment, a semiconductor device in which both the planar MOSFET and FinFET are embedded can be fabricated by a simple process. In particular, the surface of the gate electrode material 120 can be planarized over the entire surfaces of a planar MOSFET region 20 and FinFET region 30, so a fine gate pattern can be formed.

Also, as in the first embodiment, the overetching amount of a gate insulating film 100A can be reduced, so the reliability of the gate insulating film 100A can be improved.

Furthermore, as described above, the surface of the gate electrode material 120 as a dummy gate electrode can be planarized over the entire surfaces of the planar MOSFET region 20 and FinFET region 30. Therefore, a so-called FUSI (Full Silicidation) process can be performed as in this embodiment.

Additionally, in this embodiment, as in the second embodiment, after source regions 130 and 140 and drain regions (not shown) are formed by a high-temperature annealing step, the full-silicide gate electrode 180 made of a metal gate electrode material 170 can be formed. As a consequence, the withstand voltage and reliability of the gate insulating film 100A and gate insulating films 100B and 100C can be improved.

Also, as in the second embodiment, when ion implantation is performed for the gate electrode materials 110 and 120 before they are silicidized, the work function of the full-silicide gate electrode 180 can be changed, and thereby the gate threshold voltage can be adjusted.

Note that the third embodiment described above is merely an example and does not limit the present invention. For example, it is also possible to silicidize only portions of the gate electrode materials 110 and 120, instead of silicidizing the whole gate electrode materials 110 and 120. More specifically, the silicide material deposited on the gate electrode material 120 in the planar MOSFET region 20 is removed before silicidation. Accordingly, it is only necessary to silicidize only the gate electrode materials 110 and 120 in the FinFET region 30, without silicidizing the gate electrode materials 110 and 120 in the planar MOSFET region 20.

(4) Fourth Embodiment

FIGS. 14A to 15B illustrate a semiconductor device fabrication method according to the fourth embodiment of the present invention. Note that the steps shown in FIGS. 1A to 4B in the first embodiment are the same as in the fourth embodiment, so an explanation thereof will be omitted.

Figure 14B:
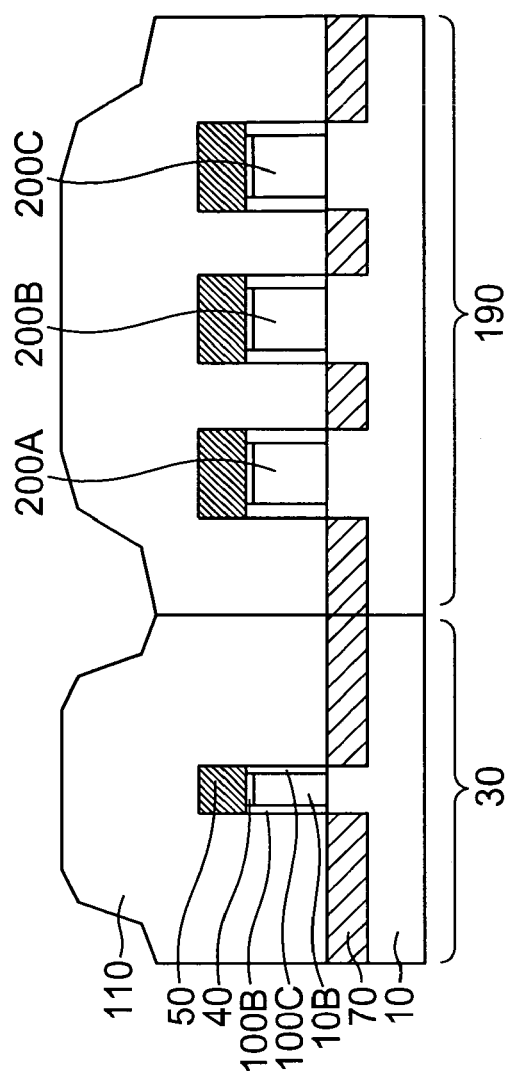
FIGS. 14A and 14B are longitudinal sectional views showing the sectional structure of elements in a predetermined step of a semiconductor device fabrication method according to the fourth embodiment of the present invention.
Figure 14A:
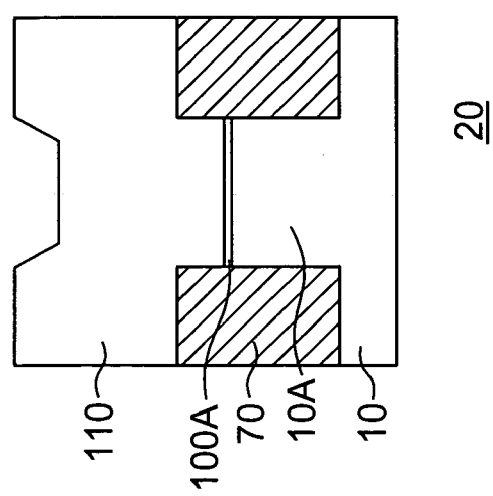

This embodiment, however, differs from the first embodiment in that, as shown in FIGS. 14A and 14B, a plurality of dummy fins 200A to 200C which are not actually used as a FinFET are formed in a device isolation region 190 positioned in the periphery of a FinFET region 30. Note that the shape and dimensions, except for the height, of the dummy fins 200A to 200C need not be the same as a fin 10B formed in the FinFET region 30.

In this method, a gate electrode material 110 about 300 nm thick made of, e.g., polysilicon is deposited by CVD or the like. As shown in FIGS. 15A and 15B, the gate electrode material 110 is planarized by CMP by using a device isolation insulating film 70 in a planar MOSFET region 20, a mask material 50 in the FinFET region 30, and mask materials 210A to 210C in the device isolation region 190 as stoppers.

By additionally forming a plurality of dummy fins 200A to 200C as stoppers as described above, the planarization process by CMP can be easily performed.

After that, the same steps as shown in FIGS. 7A to 9B of the first embodiment are executed to fabricate a semiconductor device in which both the planar MOSFET and FinFET are embedded.

In this embodiment as described above, as in the first embodiment, a semiconductor device in which both the planar MOSFET and FinFET are embedded can be fabricated by a simple process. In particular, the surface of a gate electrode material 120 can be planarized over the entire surfaces of the planar MOSFET region 20 and FinFET region 30, so a fine gate pattern can be formed.

Also, as in the first embodiment, the overetching amount of a gate insulating film 100A can be reduced, so the reliability of the gate insulating film 100A can be improved.

(5) Fifth Embodiment

FIGS. 16A to 24B illustrate a semiconductor device fabrication method according to the fifth embodiment of the present invention. Note that the steps shown in FIGS. 1A to 2B in the first embodiment are the same as in the fifth embodiment, so an explanation thereof will be omitted.

Note that the gate insulating film of the planar MOSFET and the gate insulating film of the FinFET are formed at the same time (i.e., in the same step) in the first to fourth embodiments, but a gate insulating film of a planar MOSFET and a gate insulating film of a FinFET are formed separately (i.e., in different steps) in the fifth to eighth embodiments.

As shown in FIGS. 16A and 16B, after a resist 80 is removed, gate insulating films 220A and 220B about 1.2 nm thick made of, e.g., silicon oxynitride (SiON) films are formed on a pair of opposing side surfaces of the four side surfaces of a fin 10B in a FinFET region 30.

As shown in FIGS. 17A and 17B, a gate electrode material 230 about 300 nm thick made of, e.g., polysilicon is deposited as a first layer by CVD or the like. As shown in FIGS. 18A and 18B, the gate electrode material 230 is planarized by CMP by using a mask material 50 and device isolation insulating film 70 in a planar MOSFET region 20 and the mask material 50 in the FinFET region 30 as stoppers.

As shown in FIGS. 19A and 19B, the mask material 50, device isolation insulating film 70, and gate electrode material 230 are coated with a photoresist, and exposure and development are performed to form a resist mask 240 having a pattern which opens in the planar MOSFET region 20 of a semiconductor substrate 10, and cover the FinFET region 30 with the resist mask 240.

The mask material 50 formed in the planar MOSFET region 20 is removed by RIE by using the resist mask 240 as a mask. After that, a silicon oxide film 40 formed in the planar MOSFET region 20 is removed by wet etching using hydrofluoric acid (HF).

As shown in FIGS. 20A and 20B, the resist mask 240 is removed, and a gate insulating film 250 about 1 nm thick made of, e.g., a silicon oxynitride (SiON) film is formed on the surface of a projection 10A in the planar MOSFET region 20 of the semiconductor substrate 10. The gate insulating film 250 is also formed on the gate electrode material 230 and mask material 50 in the FinFET region 30.

As shown in FIGS. 21A and 21B, the device isolation insulating film 70 and gate insulating film 250 are coated with a photoresist, and exposure and development are performed to form a resist mask 260 having a pattern which opens in the FinFET region 30 of the semiconductor substrate 10, and cover the planar MOSFET region 20 with the resist mask 260. The gate insulating film 250 formed in the FinFET region 30 is removed by RIE or wet etching using hydrofluoric acid (HF) by using the resist mask 260 as a mask.

As shown in FIGS. 22A and 22B, the resist mask 260 is removed, and a gate electrode material 270 made of, e.g., polysilicon is deposited as a second layer by CVD or the like. As shown in FIGS. 23A and 23B, the gate electrode material 270 is planarized by CMP over the entire surfaces of the planar MOSFET region 20 and FinFET region 30.

As shown in FIGS. 24A and 24B, after a mask material 280 about 70 nm thick is deposited on the gate electrode material 270, the mask material 280 and gate electrode materials 230 and 270 are sequentially patterned by lithography and RIE, thereby forming a gate pattern. Note that this gate pattern may also be formed by using a so-called sidewall pattern transfer process.

After that, the same step as shown in FIGS. 9A and 9B of the first embodiment is executed to fabricate a semiconductor device in which both the planar MOSFET and FinFET are embedded.

In this embodiment as described above, as in the first embodiment, a semiconductor device in which both the planar MOSFET and FinFET are embedded can be fabricated by a simple process. In particular, the surface of the gate electrode material 270 can be planarized over the entire surfaces of the planar MOSFET region 20 and FinFET region 30, so a fine gate pattern can be formed.

Also, in this embodiment, the gate insulating film 250 of the planar MOSFET and the gate insulating films 220A and 220B of the FinFET can be formed separately (i.e., in different steps). This makes it possible to apply materials and process conditions best suited to the individual gate insulating films, and thereby improve the performance of the planar MOSFET and FinFET.

(6) Sixth Embodiment

FIGS. 25A to 28B illustrate a semiconductor device fabrication method according to the sixth embodiment of the present invention. Note that the steps shown in FIGS. 1A to 2B of the first embodiment and the steps shown in FIGS. 16A to 20B of the fifth embodiment are the same as in the sixth embodiment, so an explanation thereof will be omitted.

As shown in FIGS. 25A and 25B, a gate electrode material 290 made of, e.g., polysilicon is deposited as a second layer on a gate insulating film 250 and device isolation insulating film 70 in a planar MOSFET region 20 of a semiconductor substrate 10.

In this step, the gate electrode material 290 is also deposited on the gate insulating film 250 in a FinFET region 30. That is, in this embodiment, the gate insulating film 250 and gate electrode material 290 for forming a planar MOSFET are formed on a gate electrode material 230 and mask material 50 in the FinFET region 30.

As shown in FIGS. 26A and 26B, the gate electrode material 290 is coated with a photoresist, and exposure and development are performed to form a resist mask 300 having a pattern which opens in the FinFET region 30 of the semiconductor substrate 10, and cover the planar MOSFET region 20 with the resist mask 300. The resist mask 300 is used as a mask to remove the gate insulating film 250 and gate electrode material 290 which are formed in the FinFET region 30 by RIE. Note that the gate insulating film 250 may also be removed by wet etching using hydrofluoric acid (HF), instead of RIE.

As shown in FIGS. 27A and 27B, the resist mask 300 is removed by processing using a solution mixture (SH) of aqueous hydrogen peroxide and sulfuric acid. In this step, an insulating film (not shown) made of a thin oxide film is formed on the upper surface of the gate electrode material 290 in the planar MOSFET region 20 and on the upper surface of the gate electrode material 230 in the FinFET region 30. This insulating film is removed by processing the upper surface of the gate electrode material 290 in the planar MOSFET region 20 and the upper surface of the gate electrode material 230 in the FinFET region 30.

Then, a gate electrode material 310 about 70 nm thick made of, e.g., polysilicon is deposited as a third layer on the entire surface by CVD or the like. If necessary, the gate electrode material 310 is planarized by CMP.

Figure 28A:
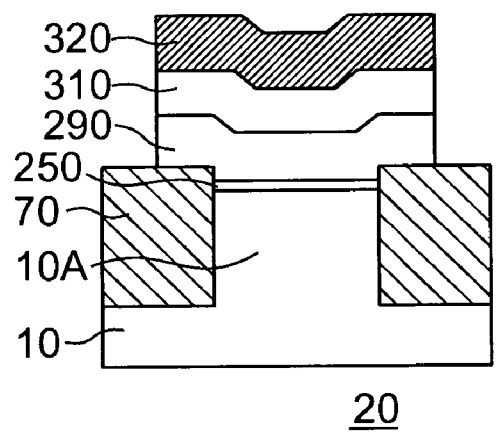
FIGS. 28A and 28B are longitudinal sectional views showing the sectional structure of elements in a predetermined step of the semiconductor device fabrication method.
Figure 28B:
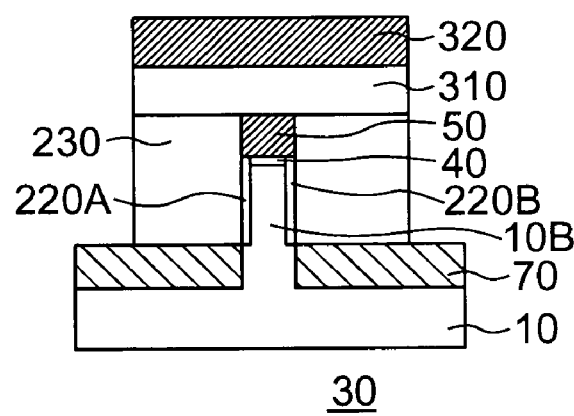

As shown in FIGS. 28A and 28B, a mask material 320 about 70 nm thick is deposited on the gate electrode material 310, and the mask material 320 and gate electrode materials 230, 290, and 310 are sequentially patterned by lithography and RIE, thereby forming a gate pattern. Note that this gate pattern may also be formed by using a so-called sidewall pattern transfer process.

After that, the same step as shown in FIGS. 9A and 9B of the first embodiment is executed to fabricate a semiconductor device in which both the planar MOSFET and FinFET are embedded.

In this embodiment as described above, as in the first embodiment, a semiconductor device in which both the planar MOSFET and FinFET are embedded can be fabricated by a simple process. In particular, the surface of the gate electrode material 310 can be planarized over the entire surfaces of the planar MOSFET region 20 and FinFET region 30, so a fine gate pattern can be formed.

Also, as in the fifth embodiment, the gate insulating film 250 of the planar MOSFET and gate insulating films 220A and 220B of the FinFET can be formed separately (i.e., in different steps). This makes it possible to apply materials and process conditions best suited to the individual gate insulating films, and thereby improve the performance of the planar MOSFET and FinFET.

Furthermore, in this embodiment, when the resist mask 300 is removed, the insulating film formed on the upper surface of the gate electrode material 290 in the planar MOSFET region 20 and on the upper surface of the gate electrode material 230 in the FinFET region 30 is removed before the gate electrode material 310 is deposited.

This avoids the formation of an interface insulating film between the gate electrode materials 290 and 310 in the planar MOSFET region 20, and between the gate electrode materials 230 and 310 in the FinFET region 30.

Accordingly, an impurity doped in the gate electrode material 310 can be well diffused in the underlying gate electrode materials 230 and 290. Also, when the gate electrode materials 230, 290, and 310 are etched, the stoppage of the etching by an interface insulating film can be prevented. In addition, when the gate electrode materials 230, 290, and 310 are entirely silicidized in, e.g., a FUSI process, the stoppage of the silicide reaction by an interface insulating film can be prevented.

(7) Seventh Embodiment

FIGS. 29A to 34B illustrate a semiconductor device fabrication method according to the seventh embodiment of the present invention. Note that the steps shown in FIGS. 1A to 2B in the first embodiment and the steps shown in FIGS. 16A to 18B of the fifth embodiment are the same as in the seventh embodiment, so an explanation thereof will be omitted.

As shown in FIGS. 29A and 29B, when a gate electrode material 230 is planarized by CMP, an insulating film (not shown) made of a thin oxide film is formed on the upper surface of the gate electrode material 230 in a FinFET region 30. This insulating film is removed by processing the upper surface of the gate electrode material 230 in the FinFET region 30 by using hydrofluoric acid (HF).

A gate electrode material 330 about 70 nm thick made of, e.g., polysilicon is deposited as a second layer on the gate electrode material 230 and a mask material 50 in the FinFET region 30 of a semiconductor substrate 10. In this step, the gate electrode material 330 is also deposited on the mask material 50 and a device isolation insulating film 70 in a planar MOSFET region 20.

As shown in FIGS. 30A and 30B, the gate electrode material 330 is coated with a photoresist, and exposure and development are performed to form a resist mask 340 having a pattern which opens in the planar MOSFET region 20 of the semiconductor substrate 10, and cover the FinFET region 30 with the resist mask 340. The gate electrode material 330 deposited in the planar MOSFET region 20 is removed by RIE by using the resist mask 340 as a mask.

As shown in FIGS. 31A and 31B, the resist mask 340 is removed, and hot phosphoric acid obtained by heating phosphoric acid is used to remove the mask material 50 formed in the planar MOSFET region 20. After that, a silicon oxide film 40 formed in the planar MOSFET region 20 is removed by wet etching using hydrofluoric acid (HF).

Subsequently, a gate insulating film 350 about 1 nm thick made of, e.g., hafnium silicate nitride (HfSiON) film is formed on the surface of a projection 10A in the planar MOSFET region 20 of the semiconductor substrate 10. In this step, the gate insulating film 350 is also formed on the gate electrode material 330 in the FinFET region 30.

As shown in FIGS. 32A and 32B, a gate electrode material 360 made of, e.g., polysilicon is deposited as a third layer on the gate insulating film 350 and device isolation insulating film 70 in the planar MOSFET region 20 of the semiconductor substrate 10.

In this step, the gate electrode material 360 is also deposited on the gate insulating film 350 in the FinFET region 30. That is, in this embodiment, the gate insulating film 350 and gate electrode material 360 for forming a planar MOSFET are formed on the gate electrode material 330 in the FinFET region 30.

As shown in FIGS. 33A and 33B, the gate electrode material 360 is coated with a photoresist, and exposure and development are performed to form a resist mask 370 having a pattern which opens in the FinFET region 30 of the semiconductor substrate 10, and cover the planar MOSFET region 20 with the resist mask 370. The gate insulating film 350 and gate electrode material 360 formed in the FinFET region 30 are removed by RIE by using the resist mask 370 as a mask. Note that the gate insulating film 350 may also be removed by wet etching using hydrofluoric acid (HF), instead of RIE.

As shown FIGS. 34A and 34B, the resist mask 370 is removed, and, if necessary, the gate electrode material 360 is planarized by CMP (not shown). After a mask material 380 about 70 nm thick is deposited on the gate electrode material 360, the mask material 380 and gate electrode materials 230, 330, and 360 are sequentially patterned by lithography and RIE, thereby forming a gate pattern. Note that this gate pattern may also be formed by using a so-called sidewall pattern transfer process.

After that, the same step as shown in FIGS. 9A and 9B of the first embodiment is executed to fabricate a semiconductor device in which both the planar MOSFET and FinFET are embedded.

In this embodiment as described above, as in the first embodiment, a semiconductor device in which both the planar MOSFET and FinFET are embedded can be fabricated by a simple process. In particular, the surfaces of the gate electrode materials 330 and 360 can be planarized over the entire surfaces of the planar MOSFET region 20 and FinFET region 30, so a fine gate pattern can be formed.

Also, as in the fifth embodiment, the gate insulating film 350 of the planar MOSFET and gate insulating films 220A and 220B of the FinFET can be formed separately (i.e., in different steps). This makes it possible to apply materials and process conditions best suited to the individual gate insulating films, and thereby improve the performance of the planar MOSFET and FinFET.

Furthermore, in this embodiment, when the gate electrode material 230 is planarized by CMP, the insulating film formed on the upper surface of the gate electrode material 230 in the FinFET region 30 is removed before the gate electrode material 330 is deposited. This avoids the formation of an interface insulating film between the gate electrode materials 230 and 330 in the FinFET region 30.

Accordingly, as in the sixth embodiment, an impurity doped in the gate electrode material 330 can be well diffused in the underlying gate electrode material 230. Also, when the gate electrode materials 230 and 330 are etched, the stoppage of the etching by an interface insulating film can be prevented. In addition, when the gate electrode materials 230 and 330 are entirely silicidized in, e.g., a FUSI process, the stoppage of the silicide reaction by an interface insulating film can be prevented.

Furthermore, in this embodiment, when the mask material 50 formed in the planar MOSFET region 20 is removed (FIGS. 31A and 31B), hot phosphoric acid can be used because the resist 340 is not formed in the FinFET region 30. This makes it possible to readily remove the mask material 50 alone without removing the underlying silicon oxide film 40.

(8) Eighth Embodiment

FIGS. 35A to 36B illustrate a semiconductor device fabrication method according to the eighth embodiment of the present invention. Note that the steps shown in FIGS. 1A to 2B in the first embodiment and the steps shown in FIGS. 16A to 18B of the fifth embodiment are the same as in the eighth embodiment, so an explanation thereof will be omitted.

As shown in FIGS. 35A and 35B, when a gate electrode material 230 is planarized by CMP, an insulating film (not shown) made of a thin oxide film is formed on the upper surface of the gate electrode material 230 in a FinFET region 30. This insulating film is removed by processing the upper surface of the gate electrode material 230 in the FinFET region 30 by using hydrofluoric acid (HF).

A gate electrode material 390 about 70 nm thick made of, e.g., polysilicon is deposited as a second layer only on the gate electrode material 230 and a mask material 50 in the FinFET region 30 of a semiconductor substrate 10 by selective deposition or selective epitaxial growth. In this step, the gate electrode material 390 is not deposited on the mask material 50 and a device isolation insulating film 70 in a planar MOSFET region 20. Note that the width of a fin 10B is small, and the film formed by selective epitaxial growth also grows in the lateral direction, so films of the gate electrode material 390 grow from the right and left and connect to each other near a portion above the mask material 50.

As shown in FIGS. 36A and 36B, the mask material 50 formed in the planar MOSFET region 20 is removed by using hot phosphoric acid obtained by heating phosphoric acid.

After that, the same steps as shown in FIGS. 31A to 34B of the seventh embodiment and the same step as shown in FIGS. 9A and 9B of the first embodiment are executed to fabricate a semiconductor device in which both the planar MOSFET and FinFET are embedded.

In this embodiment as described above, as in the first embodiment, a semiconductor device in which both the planar MOSFET and FinFET are embedded can be fabricated by a simple process. In particular, the surfaces of the gate electrode materials 360 and 390 can be planarized over the entire surfaces of the planar MOSFET region 20 and FinFET region 30, so a fine gate pattern can be formed.

Also, as in the fifth embodiment, a gate insulating film 350 of the planar MOSFET and gate insulating films 220A and 220B of the FinFET can be formed separately (i.e., in different steps). This makes it possible to apply materials and process conditions best suited to the individual gate insulating films, and thereby improve the performance of the planar MOSFET and FinFET.

Furthermore, in this embodiment, when the gate electrode material 230 is planarized by CMP, the insulating film formed on the upper surface of the gate electrode material 230 in the FinFET region 30 is removed before the gate electrode material 390 is deposited. This avoids the formation of an interface insulating film between the gate electrode materials 230 and 390 in the FinFET region 30.

Accordingly, as in the sixth embodiment, an impurity doped in the gate electrode material 390 can be well diffused in the underlying gate electrode material 230. Also, when the gate electrode materials 230 and 390 are etched, the stoppage of the etching by an interface insulating film can be prevented. In addition, when the gate electrode materials 230 and 390 are entirely silicidized in, e.g., a FUSI process, the stoppage of the silicide reaction by an interface insulating film can be prevented.

Furthermore, as in the seventh embodiment, when the mask material 50 formed in the planar MOSFET region 20 is removed (FIGS. 36A and 36B), hot phosphoric acid can be used because no resist is not formed in the FinFET region 30. Therefore, the mask material 50 alone can be readily removed without removing an underlying silicon oxide film 40.

Note that the fifth to eighth embodiments described above are merely examples and do not limit the present invention. For example, the gate electrode materials formed into the gate pattern may also be replaced with metal gate electrode materials by performing a damascene process as in the second embodiment, or silicidized by performing a FUSI process as in the third embodiment.

(9) Ninth Embodiment

FIGS. 37A to 47B illustrate a semiconductor device fabrication method according to the ninth embodiment of the present invention. In this embodiment, an SOI (Silicon On Insulator) substrate obtained by stacking a buried insulating film and semiconductor layer on a semiconductor substrate is prepared, and a planar MOSFET and FinFET are formed on this SOI substrate. In the ninth embodiment, the same steps as in the eighth embodiment are executed on the SOI substrate.

As shown in FIGS. 37A and 37B, an SOI substrate obtained by stacking a buried insulating film 410 and semiconductor layer 420 on a semiconductor substrate 400 is prepared. After a silicon oxide ($SiO_2$) film 40 about 2 nm thick is formed on the semiconductor layer 420, a mask material 50 about 100 nm thick made of, e.g., a silicon nitride (SiN) film is deposited.

The mask material 50 and silicon oxide film 40 are sequentially patterned by lithography and RIE. In addition, the mask material 50 is used as a mask to etch the semiconductor layer 420, thereby exposing the upper surface of the buried insulating film 410.

High density plasma CVD is used to deposit a device isolation insulating film 70 made of, e.g., a silicon oxide film on the entire surfaces of the buried insulating film 410 and mask material 50. The mask material 50 is used as a stopper to planarize the device isolation insulating film 70 by CMP, thereby exposing the upper surface of the mask material 50.

As shown in FIGS. 38A and 38B, the mask material 50 and device isolation insulating film 70 are coated with a photoresist, and exposure and development are performed to form a resist mask 80 having a pattern which opens in a FinFET region 30 of the semiconductor substrate 400, and cover a planar MOSFET region 20 with the resist mask 80.

The device isolation insulating film 70 formed in the FinFET region 30 is etched by RIE by using the mask material 50 and resist mask 80 as masks, thereby exposing the upper surface of the buried insulating film 410 in the FinFET region 30.

After that, steps shown in FIGS. 39A to 47B which are the same steps as shown in FIGS. 16A to 18B of the fifth embodiment, FIGS. 35A to 36B of the eight embodiment, and FIGS. 31A to 34B of the seventh embodiment and the same step as shown in FIGS. 9A and 9B of the first embodiment are executed to fabricate a semiconductor device in which both the planar MOSFET and FinFET are embedded.

In this embodiment as described above, the same effects as in the eighth embodiment can be obtained.

Note that the ninth embodiment described above is merely an example and does not limit the present invention. For example, not the same steps as in the eighth embodiment but the same steps as in any of the first to seventh embodiments may also be performed on the SOI substrate.

(10) 10th Embodiment

In each of the first to ninth embodiments, a method of forming a fine gate pattern when a semiconductor device containing both the planar MOSFET and FinFET is to be fabricated is explained. In the 10th embodiment, a method of forming a fine fin in a FinFET will be explained.

Figure 48:
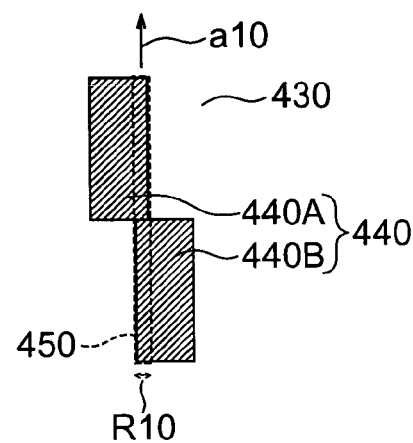
FIG. 48 is a plan view of elements in a predetermined step of a semiconductor device fabrication method according to the 10th embodiment of the present invention.
Figure 49:
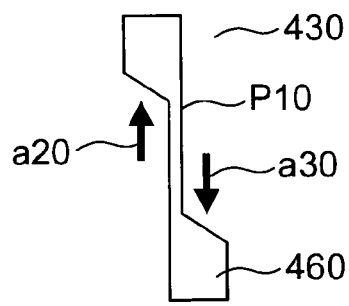
FIG. 49 is a plan view of elements in a predetermined step of the same semiconductor fabrication method.
Figure 50:
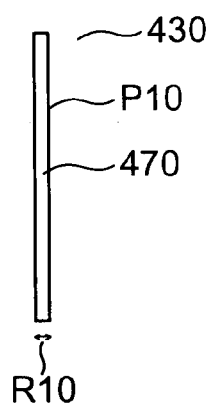
FIG. 50 is a plan view of elements in a predetermined step of the same semiconductor fabrication method.

FIGS. 48 to 50 illustrate the method of forming a fin of a FinFET according to the 10th embodiment of the present invention. Note that FIGS. 48 to 50 each show a plan view when elements in a predetermined step are viewed from the above.

As shown in FIG. 48, a semiconductor substrate 430 in which the crystal orientation (i.e., the crystal direction) is (110) is coated with a resist, and electron beam irradiation and development are performed by the electron beam lithography technique, thereby forming a resist mask 440 made up of resists 440A and 440B. Note that (110) represents the crystal orientation by three-dimensional vectors.

The resist mask 440 has a pattern in which the resists 440A and 440B having a width larger than a width R10 of a fin formation region 450 are formed along the direction of <112> (the longitudinal direction of a fin to be formed later) indicated by an arrow a10 in FIG. 48, so as to cover the fin formation region 450, and are formed to be staggered from each other in a direction perpendicular to the <112> direction. Note that <112> indicates three-dimensional vectors.

As shown in FIG. 49, the resist mask 440 is used as a mask to etch the semiconductor substrate 430 by wet etching using, e.g., TMAH (Tetra Methyl Ammonium Hydroxide).

This wet etching using TMAH has crystal orientation dependence by which the etching rate changes in accordance with the crystal orientation. For example, the etching rate is low on a (111) surface P10 whose crystal orientation is (111).

In this case, therefore, etching progresses in the direction of depth of the semiconductor substrate 430 to form a projection 460 on the semiconductor substrate 430. In addition, of the projection 460 positioned below the resist mask 440, etching progresses in a region except for the fin formation region 450 in directions indicated by arrows a20 and a30 shown in FIG. 49. Consequently, as shown in FIG. 50, a fine fin 470 having a side surface P10 whose crystal orientation is (111) is formed on the semiconductor substrate 430.

In this embodiment as described above, it is possible to form the fin 470 having a small width, i.e., fineness which cannot be formed by lithography, and having a small LER (Line Edge Roughness), i.e., small undulations (small variations in width and high uniformity). Also, the shape of the fin 470 can be formed into not a tapered shape but a rectangular shape.

(11) 11th Embodiment

FIGS. 51A to 56B illustrate a FinFET fabrication method according to the 11th embodiment of the present invention. In this embodiment, a method of fabricating a FinFET having a plurality of fins by using the fin formation method according to the 10th embodiment will be explained.

Note that FIGS. 51A to 56A each show a plan view when elements in a predetermined step are viewed from the above, and FIGS. 51B to 56B each show a longitudinal sectional view when elements in a predetermined step are cut along a line A-A shown in FIG. 51A.

As shown in FIGS. 51A and 51B, an SOI substrate 500 in which a buried insulating film 480 and semiconductor layer 490 are stacked on a semiconductor substrate (not shown) having a surface whose orientation is (110) is prepared, and a mask material 510 about 70 nm thick made of, e.g., a silicon nitride (SiN) film is deposited on the semiconductor layer 490 by CVD or the like.

The mask material 510 is coated with a resist, and electron beam irradiation and development are performed by the electron beam lithography technique to form a resist mask 520. As in the 10th embodiment, the resist mask 520 has a pattern in which resists 520B and 520C wider than a fin width are formed to be staggered from each other in fin formation regions, and resists 520A and 520D are formed in source/drain formation regions.

As shown in FIGS. 52A and 52B, the resist mask 520 is used as a mask to etch the mask material 510 by RIE. After that, as shown in FIGS. 53A and 53B, the resist mask 520 is removed to form a hard mask made of the mask material 510.

As shown in FIGS. 54A and 54B, as in the 10th embodiment, the mask material 510 is used as a mask to etch the semiconductor layer 490 by wet etching having crystal orientation dependence by using, e.g., TMAH (Tetra Methyl Ammonium Hydroxide), thereby forming fins 490B having side surfaces whose crystal orientation is (111).

Figure 55B:
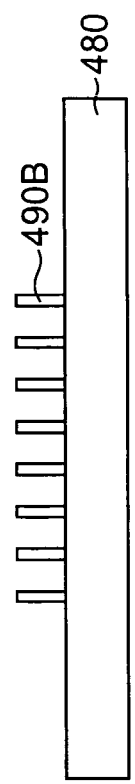
FIGS. 55A and 55B are longitudinal sectional views showing the sectional structure of elements in a predetermined step of the semiconductor device fabrication method.
Figure 55A:
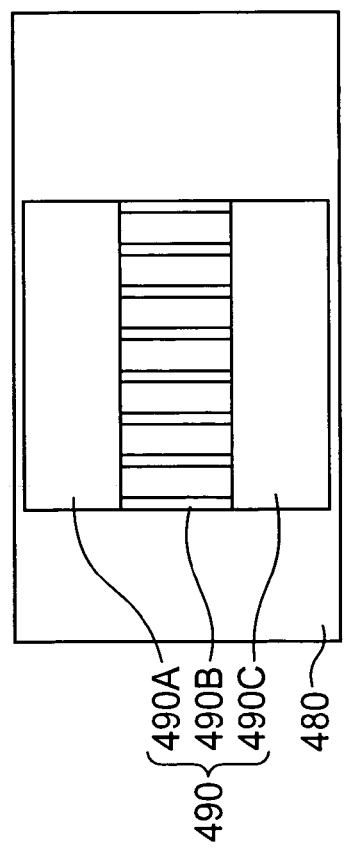

That is, as shown in FIG. 54C, of the semiconductor layer 490 positioned below the mask materials 510B and 510C, regions except for fin formation regions are etched away to form the fins 490B having small side-surface undulations. Note that the process conditions are so adjusted that a width R20 of the overlapped portion of the mask materials 510B and 510C is equal to the width of the fins 490B. After that, the mask material 510 is removed as shown in FIGS. 55A and 55B.

As shown in FIGS. 56A and 56B, a gate insulating film (not shown) made of, e.g., a hafnium silicate nitride (Hf-SiON) film is formed on the side surfaces and upper surfaces of the fins 490B, and then a gate electrode 530 is formed.

After a source region 560 and drain region 570 are formed in semiconductor layers 490A and 490C by ion implantation, a sidewall insulating film (not shown) is formed on the side surfaces of the gate electrode 530. A silicide film (not shown) is formed in the surface portions of the gate electrode 530, source region 560, and drain region 570. Note that oblique ion implantation or plasma doping can be used as ion implantation. Note also that the gate electrode 530 may also be entirely silicidized.

After that, wiring is performed by sequentially forming an interlayer dielectric film 580 and contact plug 590, thereby fabricating a FinFET.

In this embodiment as described above, it is possible to form the fins 490B having a small width, i.e., fineness which cannot be formed by lithography, and having a small LER (Line Edge Roughness), i.e., small undulations (small variations in width and high uniformity). Also, the shape of the fins 490B can be formed into not a tapered shape but a rectangular shape. In addition, this embodiment can reduce variations in gate threshold voltage.

(12) 12th Embodiment

FIGS. 57A to 65B illustrate a FinFET fabrication method according to the 12th embodiment of the present invention. In this embodiment, a mask pattern is formed by using the sidewall pattern transfer process described earlier, rather than the electron beam lithography technique used in the 11th embodiment. After that, as in the 11th embodiment, fins are formed by using wet etching having crystal orientation dependence, thereby fabricating a FinFET having a plurality of fins.

Figure 58B:
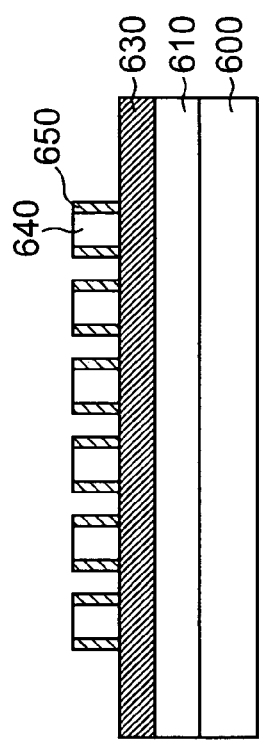
FIGS. 58A, 58B and 58C are longitudinal sectional views showing the sectional structure of elements in a predetermined step of the semiconductor device fabrication method.
Figure 58A:
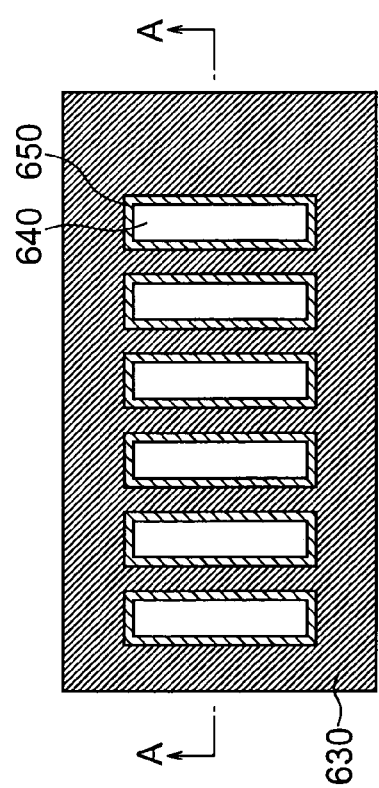

Note that FIGS. 57A to 65A each show a plan view when elements in a predetermined step are viewed from the above, and FIGS. 57B to 65B each show a longitudinal sectional view when elements in a predetermined step are cut along a line A-A shown in FIG. 58A.

As shown in FIGS. 57A and 57B, an SOI substrate 620 in which a buried insulating film 600 and semiconductor layer 610 are stacked on a semiconductor substrate (not shown) having a surface whose orientation is (110) is prepared, and a mask material 630 about 70 nm thick made of, e.g., a silicon nitride (SiN) film is deposited on the semiconductor layer 610 by CVD or the like.

As shown in FIGS. 58A and 58B, an amorphous silicon film about 100 nm thick is deposited on the mask material 630 and patterned by lithography and RIE, thereby forming a dummy amorphous film 640 to be removed later.

After an insulating film about 20 nm thick made of, e.g., a TEOS (Tetraethoxysilane) film is deposited by CVD, a sidewall insulating film 650 is formed on the side surfaces of the amorphous silicon film 640 by RIE.

Figure 58C:
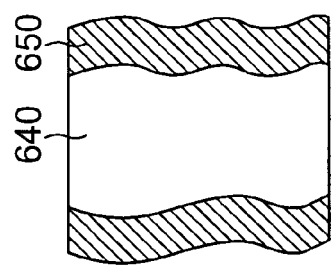

In this step, as shown in FIG. 58C, LER or undulations of about 2 to 4 nm are formed on the side surfaces of the amorphous silicon film 640. Accordingly, undulations corresponding to the undulations formed on the side surfaces of the amorphous silicon film 640 are also formed on the side surfaces of the sidewall insulating film 650.

As shown in FIGS. 59A and 59B, the amorphous silicon film 640 is removed by wet etching or RIE. In this step, as shown in FIG. 59C, undulations corresponding to the undulations formed on the side surfaces of the amorphous silicon film 640 are formed on the side surfaces of the sidewall insulating film 650.

As shown in FIGS. 60A and 60B, the mask material 630 is coated with a resist, and exposure and development are performed to form a resist mask 660 made up of resists 660A and 660B in source/drain formation regions.

As shown in FIGS. 61A and 61B, the mask material 630 is etched by RIE by using the sidewall insulating film 650 and resist mask 660 as masks. After that, as shown in FIGS. 62A and 62B, the sidewall insulating film 650 and resist mask 660 are removed by an asher and wet etching, thereby forming a hard mask made up of mask materials 630A to 630C. In this step, as shown in FIG. 62C, undulations corresponding to the undulations formed on the side surfaces of the sidewall insulating film 650 are formed on the side surfaces of the mask material 630.

As shown in FIGS. 63A and 63B, as in the 10th embodiment, the mask material 630 is used as a mask to etch the semiconductor layer 610 by wet etching having crystal orientation dependence by using, e.g., TMAH (Tetra Methyl Ammonium Hydroxide), thereby forming fins 610B having side surfaces whose crystal orientation is (111) below the mask material 630B.

That is, as shown in FIGS. 63C and 63D, of the semiconductor layer 610 positioned below the mask material 630B, regions except for fin formation regions are etched away to form the fins 610B having small side-surface undulations. Note that the process conditions are so adjusted that the width of the mask material 630B (i.e., the deposition thickness of the sidewall insulating film 650) is equal to the sum of a width R30 of the fins 610B and a width R40 of the undulations. It is also possible to measure the width of the undulations of the amorphous silicon film 640, and determine the deposition thickness of the sidewall insulating film 650 on the basis of the measurement results.

As shown in FIGS. 64A and 64B, a gate insulating film (not shown) made of, e.g., a hafnium silicate nitride (Hf-SiON) film is formed on the side surfaces of the fins 610B, and a gate electrode 640 is formed. After that, as in the 11th embodiment, source and drain regions, a sidewall insulating film, and a silicide film (none of them is shown) are sequentially formed. As shown in FIGS. 65A and 65B, wiring is performed by sequentially forming an interlayer dielectric film 670 and contact plug 660, thereby fabricating a FinFET.

In this embodiment as described above, as in the 11th embodiment, it is possible to form the fins 610B having a small width, i.e., fineness which cannot be formed by lithography, and having a small LER (Line Edge Roughness), i.e., small undulations (small variations in width and high uniformity). Also, the shape of the fins 610B can be formed into not a tapered shape but a rectangular shape. In addition, this embodiment can reduce variations in gate threshold voltage.

Furthermore, in this embodiment, a mask pattern is formed by using the sidewall pattern transfer process, rather than the electron beam lithography technique. This makes it possible to form the fins 610B within a short time period, and accurately control the width of the fins 610B.

(13) 13th Embodiment

Figure 66B:
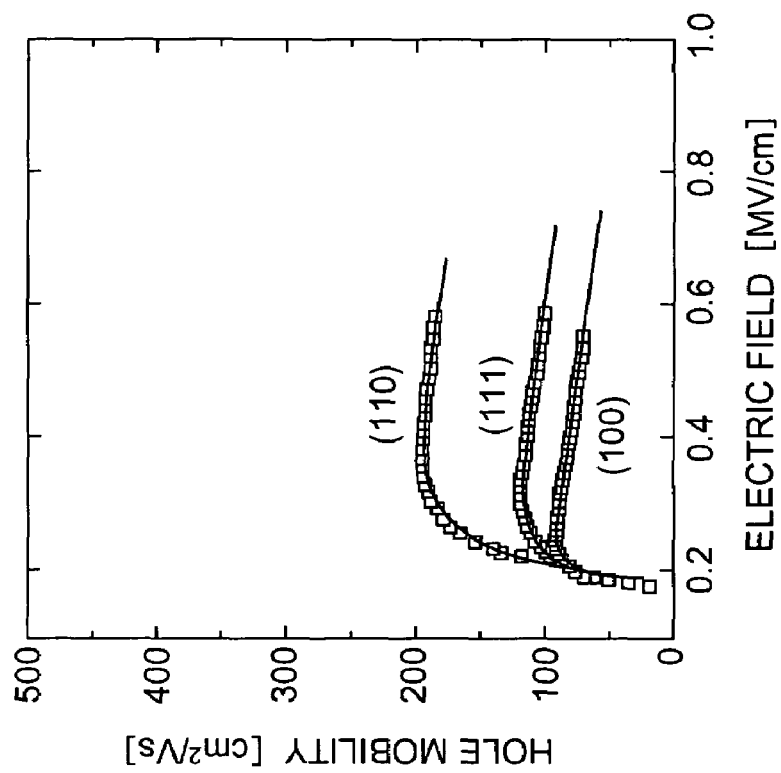
FIGS. 66A and 66B are graphs showing the crystal orientation dependence of the carrier mobility.
Figure 66A:
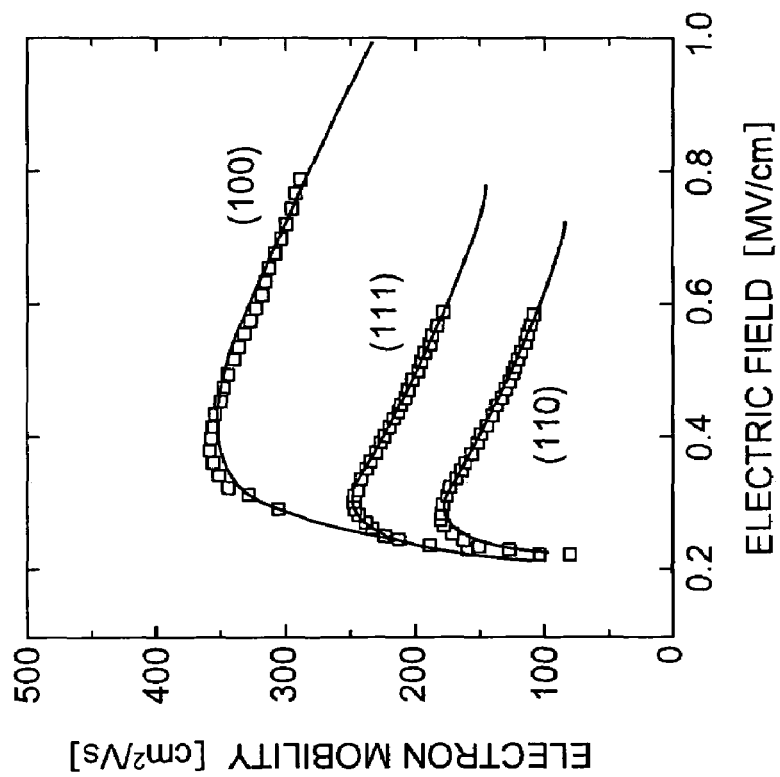

FIGS. 66A and 66B each show the crystal orientation dependence of the carrier mobility. The mobility (the index of the ease with which particles move) of carriers which contribute to conduction in a channel region has crystal orientation dependence which changes in accordance with the crystal orientation of a surface where the channel region is formed.

Of FIGS. 66A and 66B, FIG. 66A shows the crystal orientation dependence of the mobility of electrons, and FIG. 66B shows the crystal orientation dependence of the mobility of holes. In the following description, if the crystal orientation of a surface where a channel region is to be formed is (100), this surface will be referred to as a (100) surface. Note that the abscissa indicates the strength of an electric field.

As shown in FIG. 66A, the electron mobility is highest when a surface where a channel region is to be formed is a (100) surface, and decreases in the order of a (111) surface and (110) surface. On the other hand, as shown in FIG. 66B, the hole mobility is highest when a surface where a channel region is to be formed is a (110) surface, and decreases in the order of a (111) surface and (100) surface.

Accordingly, when a CMOS inverter containing a PMOSFET and NMOSFET is to be fabricated, an SOI substrate whose upper surface is a (110) surface is prepared, the PMOSFET is formed by a planar MOSFET having a channel region formed in the (110) surface, and the NMOSFET is formed by a FinFET having a channel region formed in a (111) surface. In this manner, the mobility of holes in the PMOSFET can be increased.

Figure 67B:
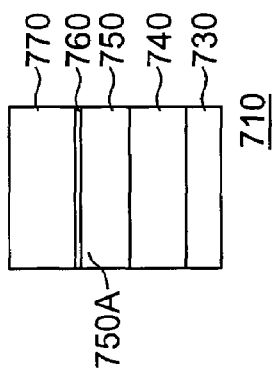
FIGS. 67A, 67B and 67C are a plan view and a longitudinal sectional view showing the sectional structure of a semiconductor device according to the 13th embodiment of the present invention.
Figure 67C:
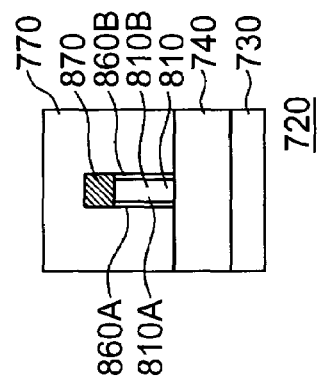
Figure 67A:
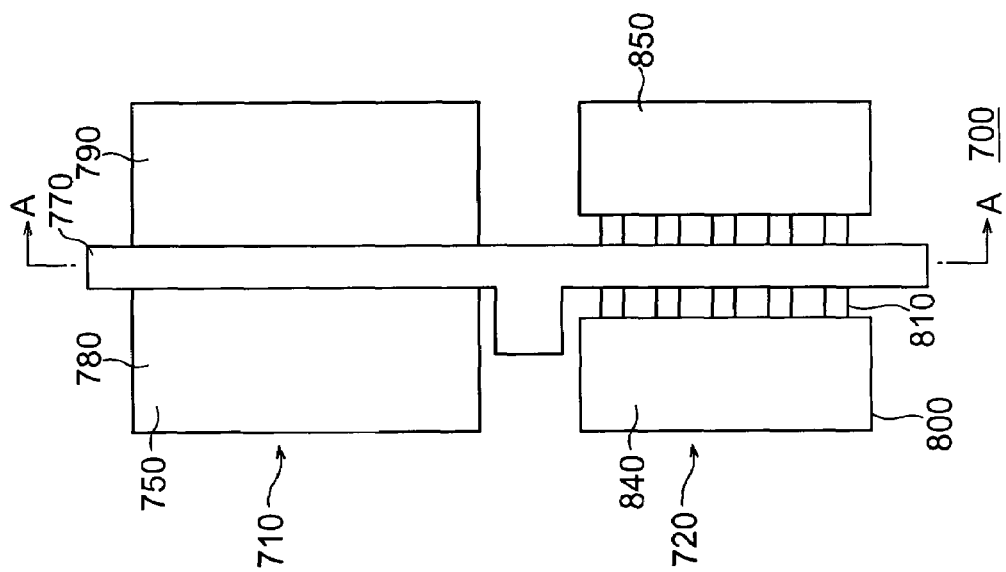

FIGS. 67A to 67C illustrate the structure of a CMOS inverter 700 formed by executing the same steps as in the ninth embodiment. The CMOS inverter 700 includes a planar MOSFET 710 as a PMOSFET, and a FinFET 720 as an NMOSFET.

FIG. 67A shows a plan view when the CMOS inverter 700 is viewed from the above. FIG. 67B shows a longitudinal sectional view when the planar MOSFET 710 is cut along a line A-A. FIG. 67C shows a longitudinal sectional view when the FinFET 720 is cut along the line A-A.

In the planar MOSFET 710, a buried insulating film 740 is formed on the surface of a semiconductor substrate 730, and a semiconductor layer 750 is formed on the buried insulating film 740. A gate electrode 770 is formed near the central portion of the semiconductor layer 750 via a gate insulating film 760.

A channel region 750A is formed below the gate electrode 770 and near the surface of the semiconductor layer 750. A source region 780 and drain region 790 are formed on the two sides of the channel region 750A.

In the FinFET 720, the buried insulating film 740 is formed on the semiconductor substrate 730, and a semiconductor layer 800 having a plurality of fins 810 is formed on the buried insulating film 740.

Note that the fins 810 of the FinFET 720 can be formed by executing the same steps as in the 11th or 12th embodiment.

That is, as in the 11th embodiment, it is possible to form a mask pattern by using the electron beam lithography technique, and form the fins 810 by wet etching having the crystal orientation dependence. Alternatively, as in the 12th embodiment, it is possible to form a mask pattern by using the sidewall pattern transfer process, and form the fins 810 by wet etching having the crystal orientation dependence.

Channel regions 810A and 810B are formed near a pair of opposing side surfaces near a central portion of each fin 810 of the semiconductor layer 800. In the semiconductor layer 800 and fins 810, a source region 840 and drain region 850 are formed on the two sides of the channel regions 810A and 810B.

Of the fins 810, gate insulating films 860A and 860B are formed on the two side surfaces near the channel regions 810A and 810B. In addition, a mask material 870 is formed on the upper surfaces of the fins 810.

On the two side surfaces and upper surfaces of the fins 810, a U-shaped gate electrode 770 is formed over the fins 810 via the gate insulating films 860A and 860B and mask material 870. Note that the gate electrode 770 is shared by the planar MOSFET 710 and FinFET 720.

The FinFET 720 has a vertical double-gate structure, and has drivability higher than that of the planar MOSFET 710. In this embodiment, therefore, the PMOSFET is formed by the planar MOSFET 710 having the channel region 750A formed on the (110) surface having the highest hole mobility, and the NMOSFET is formed by the FinFET 720 having the channel regions 810A and 810B formed on the (111) surface having a relatively high electron mobility.

This makes it possible to increase the mobility of the PMOSFET compared to that when a planar PMOSFET and NMOSFET are formed on a semiconductor substrate whose surface is a (100) surface.

Also, in this embodiment, as in the 11th embodiment, it is possible to form the fins 810 having a small width, i.e., fineness which cannot be formed by lithography, and having a small LER (Line Edge Roughness), i.e., small undulations (small variations in width and high uniformity). In addition, the shape of the fins 810 can be formed into not a tapered shape but a rectangular shape, and variations in gate threshold voltage can be reduced.

Note that the 13th embodiment described above is merely an example and does not limit the present invention. For example, the CMOS inverter may also be fabricated by executing not the same steps as in the ninth embodiment but the same steps as in any of the first to eighth embodiments.

As explained above, the first to 13th embodiments can form fine circuit patterns.

What is claimed is:
1. A semiconductor device fabrication method, comprising:
   depositing a mask material on a semiconductor substrate;
   patterning the mask material and forming a trench in a surface portion of the semiconductor substrate by etch- ing, thereby forming a first projection in a first region, and a second projection wider than the first projection in a second region;

burying a device isolation insulating film in the trench;

etching away a predetermined amount of the device isolation insulating film formed in the first region;

etching away the mask material formed in the second region;

forming a first gate insulating film on a pair of opposing side surfaces of the first projection, and a second gate insulating film on an upper surface of the second projection;

depositing a first gate electrode material on the device isolation insulating film, mask material, and second gate insulating film;

planarizing the first gate electrode material by using as stoppers the mask material formed in the first region and the device isolation insulating film formed in the second region;

depositing a second gate electrode material on the mask material, first gate electrode material, and device isolation insulating film; and patterning the first and second gate electrode materials, thereby forming a first gate electrode in the first region, and a second gate electrode in the second region.

2. A method according to claim 1, further comprising:

depositing and planarizing an interlayer dielectric film on the device isolation insulating film and first and second gate electrodes, after the first and second gate electrodes are formed;

removing the first and/or second gate electrode; and forming a third and/or fourth gate electrode in a region where the removed first and/or second gate electrode was formed.

3. A method according to claim 1, further comprising:

depositing and planarizing an interlayer dielectric film on the device isolation insulating film and first and second gate electrodes, after the first and second gate electrodes are formed; and depositing a metal on the first and second gate electrodes, and making the first and/or second gate electrode to react with the metal.

4. A method according to claim 1, wherein when the first and second projections are formed, at least one third projection is formed in a third region positioned around the first region, and when the first gate electrode material is planarized, the first gate electrode material is planarized by using as stoppers the mask materials formed in the first and third regions and the device isolation insulating film formed in the second region.

5. A method according to claim 1, wherein when the first and second gate electrodes are formed, the first and second gate electrode materials are patterned by using one of lithography and a sidewall pattern transfer process, thereby forming the first gate electrode in the first region, and the second gate electrode in the second region.

* * * * *